(12) United States Patent
Lin et al.

(10) Patent No.: US 7,958,429 B2
(45) Date of Patent: Jun. 7, 2011

(54) DISTRIBUTED PROCESSING LDPC (LOW DENSITY PARITY CHECK) DECODER

(75) Inventors: Alvin Lai Lin, Irvine, CA (US); Andrew J. Blanksby, Orange, CA (US)

(73) Assignee: Broadcom Corporation, Irvine, CA (US)

( * ) Notice: Subject to any disclaimer, the term of this patent is extended or adjusted under 35 U.S.C. 154(b) by 984 days.

(21) Appl. No.: 11/828,532

(22) Filed: Jul. 26, 2007

(65) Prior Publication Data

US 2009/0013237 A1   Jan. 8, 2009

Related U.S. Application Data

(60) Provisional application No. 60/958,014, filed on Jul. 2, 2007.

(51) Int. Cl.
*H03M 13/00* (2006.01)
(52) U.S. Cl. ........................................ 714/758; 714/774
(58) Field of Classification Search .................. 714/758, 714/774
See application file for complete search history.

(56) References Cited

U.S. PATENT DOCUMENTS

| | | | |
|---|---|---|---|
| 3,542,756 A | 11/1970 | Gallager | |
| 3,665,396 A | 5/1972 | Forney, Jr. | |
| 4,295,218 A | 10/1981 | Tanner | |
| 6,430,233 B1 | 8/2002 | Dillon et al. | |
| 6,473,010 B1 | 10/2002 | Vityaev et al. | |
| 6,567,465 B2 | 5/2003 | Goldstein et al. | |
| 6,633,856 B2 * | 10/2003 | Richardson et al. | 706/15 |
| 6,789,227 B2 * | 9/2004 | De Souza et al. | 714/804 |
| 6,895,547 B2 * | 5/2005 | Eleftheriou et al. | 714/801 |
| 2003/0014718 A1 * | 1/2003 | De Souza et al. | 714/804 |
| 2003/0104788 A1 | 6/2003 | Kim | |
| 2004/0034828 A1 * | 2/2004 | Hocevar | 714/800 |

FOREIGN PATENT DOCUMENTS

| | | | |
|---|---|---|---|
| KR | 2003-0035227 A | 5/2003 | |
| KR | 2005-0111201 A | 11/2005 | |

OTHER PUBLICATIONS

R. Gallager, Low-Density Parity-Check Codes, Cambridge, MA: MIT Press, 1963, 90 pages.
R. G. Gallager, "Low density parity check codes," IRE Trans. Info. Theory, vol. IT-8; Jan. 1962, pp. 21-28.

(Continued)

*Primary Examiner* — M. Mujtaba K Chaudry
(74) *Attorney, Agent, or Firm* — Garlick Harrison & Markison; Shayne X. Short

(57) ABSTRACT

Distributed processing LDPC (Low Density Parity Check) decoder. A means is presented herein that includes an LDPC decoding architecture leveraging a distributed processing technique (e.g., daisy chain) to increase data throughput and reduce memory storage requirements. Routing congestion and critical path latency are also improved thereby. Each daisy chain includes a number of registers, and a number of localized MUXs (e.g., MUXs having merely 2 inputs each). The means presented herein also does not contain any barrel shifters, high fan-in multiplexers, or interconnection networks; therefore, the critical path is relatively short and it can also be pipelined to further increase data throughput. If desired, a communication device can include multiple configurations of such daisy chains to accommodate the decoding of various LDPC coded signals (e.g., such as for an application and/or communication device that must decoded LDPC codes using different low density parity check matrices).

20 Claims, 16 Drawing Sheets

OTHER PUBLICATIONS

M. Luby, M. Mitzenmacher, M. A. Shokrollahi, D. A. Spielman, and V. Stemann, "Practical Loss-Resilient Codes", Proc. 29th Symp. on Theory of Computing; 1997, pp. 150-159.

T. J. Richardson and R. L. Urbanke, "The capacity of low-density parity-check code under message-passing decoding," IEEE Trans. Inform. Theory, vol. 47, No. 2, Feb. 2001, pp. 599-618.

Anastasopoulos, A., "A comparison between the sum-product and the min-sum iterative detection algorithms based on density evolution", IEEE Global Telecommunications Conference, vol. 2, No. 25-29, Nov. 2001, pp. 1021-1025.

Karkooti, M., and Cavallaro, J.R., "Semi-Parallel Reconfigurable Architectures for Real-Time LDPC Decoding", Proceedings of the International Conference on Information Technology: Coding and Computing, vol. 1, 2004, pp. 579-585.

Mansour, M.M., and Shanbhag, N.R., "Low-Power VLSI Decoder Architectures for LDPC Codes", Proceedings of the 2002 International Symposium on Low Power Electronics and Design, 2002, pp. 284-289.

Mansour, M.M., and Shanbhat, N.R., "High-Throughput LDPC Decoders", IEEE Transactions on Very Large Scale Integration Systems, vol. 11, No. 6, Dec. 2003, pp. 976-996.

Andrew J. Blanksby and Chris J. Howland, "A 690-mW 1-Gb/s 1024-b, rate-1/2 low-density parity-check code decoder", IEEE Journal of Solid-State Circuits, vol. 37, No. 3, Mar. 2002, pp. 404-412.

Zhang, T., Wang, Z., and Parni, K.; "On finite precision implementation of low density parity check codes decoder," Proceedings of ISCAS, Sydney, Australia, May 2001, pp. 202-205.

Zhong, H., and Zhang, T., "Block-LDPC: A Practical LDPC Coding System Design Approach", IEEE Transactions on Circuits and Systems, vol. 52, No. 4, Apr. 2005, pp. 766-775.

\* cited by examiner

DISTRIBUTED PROCESSING LDPC (LOW DENSITY PARITY CHECK) DECODER

CROSS REFERENCE TO RELATED PATENTS/PATENT APPLICATIONS

Provisional Priority Claims

The present U.S. Utility Patent Application claims priority pursuant to 35 U.S.C. §119(e) to the following U.S. Provisional Patent Application which is hereby incorporated herein by reference in its entirety and made part of the present U.S. Utility Patent Application for all purposes:

1. U.S. Provisional Application Ser. No. 60/958,014, entitled "Distributed processing LDPC (Low Density Parity Check) decoder,", filed Jul. 2, 2007, pending.

BACKGROUND OF THE INVENTION

1. Technical Field of the Invention

The invention relates generally to communication systems; and, more particularly, it relates to decoding of LDPC (Low Density Parity Check) coded signals within such communication systems.

2. Description of Related Art

Data communication systems have been under continual development for many years. One such type of communication system that has been of significant interest lately is a communication system that employs iterative error correction codes. Of particular interest is a communication system that employs LDPC (Low Density Parity Check) code. Communications systems with iterative codes are often able to achieve lower bit error rates (BER) than alternative codes for a given signal to noise ratio (SNR).

A continual and primary directive in this area of development has been to try continually to lower the SNR required to achieve a given BER within a communication system. The ideal goal has been to try to reach Shannon's limit in a communication channel. Shannon's limit may be viewed as being the data rate to be used in a communication channel, having a particular SNR, that achieves error free transmission through the communication channel. In other words, the Shannon limit is the theoretical bound for channel capacity for a given modulation and code rate.

LDPC codes have been shown to provide for excellent decoding performance that can approach the Shannon limit in some cases. For example, some LDPC decoders have been shown to come within 0.3 dB (decibels) from the theoretical Shannon limit. While this example was achieved using an irregular LDPC code with a length of one million, it nevertheless demonstrates the very promising application of LDPC codes within communication systems.

The use of LDPC coded signals continues to be explored within many newer application areas. Some examples of possible communication systems that may employ LDPC coded signals include communication systems employing 4 wire twisted pair cables for high speed Ethernet applications (e.g., 10 Gbps (Giga-bits per second) Ethernet operation according to the IEEE 802.3an (10GBASE-T) emerging standard) as well as communication systems operating within a wireless context (e.g., in the IEEE 802.11 context space including the IEEE 802.11n emerging standard).

For any of these particular communication system application areas, near-capacity achieving error correction codes are very desirable. The latency constraints, which would be involved by using traditional concatenated codes, simply preclude their use in such applications in very high data rate communication system application areas.

Generally speaking, within the context of communication systems that employ LDPC codes, there is a first communication device at one end of a communication channel with encoder capability and second communication device at the other end of the communication channel with decoder capability. In many instances, one or both of these two communication devices includes encoder and decoder capability (e.g., within a bi-directional communication system). LDPC codes can be applied in a variety of additional applications as well, including those that employ some form of data storage (e.g., hard disk drive (HDD) applications and other memory storage devices) in which data is encoded before writing to the storage media, and then the data is decoded after being read/retrieved from the storage media.

In many such prior art communication devices, one of the greatest hurdles and impediments in designing effective devices and/or communication devices that can decode LDPC coded signals is the typically large area and memory required to store and manage all of the updated bit edge messages and check edge messages that are updated and employed during iterative decoding processing (e.g., when storing and passing the check edges messages and the bit edges messages back and forth between a check engine and a bit engine, respectively). When dealing with relatively large block sizes in the context of LDPC codes, the memory requirements and memory management need to deal with these check edges messages and bit edges messages can be very difficult to handle. There has been and continues to be a need in the art for better means by which LDPC coded signal can be decoded to extract the information encoded therein.

BRIEF SUMMARY OF THE INVENTION

The present invention is directed to apparatus and methods of operation that are further described in the following Brief Description of the Several Views of the Drawings, the Detailed Description of the Invention, and the claims. Other features and advantages of the present invention will become apparent from the following detailed description of the invention made with reference to the accompanying drawings.

DETAILED DESCRIPTION OF THE INVENTION

Figure 1:
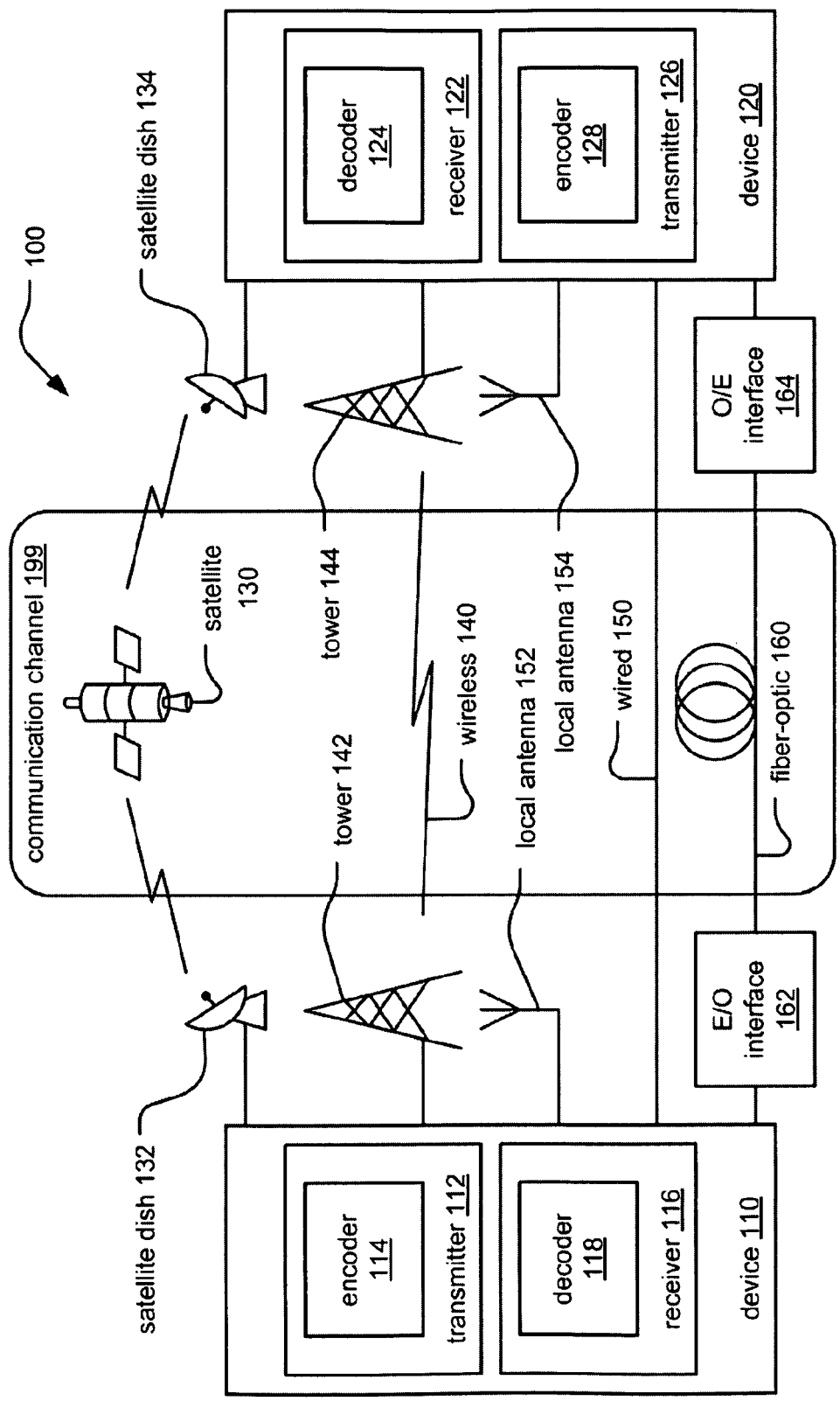
FIG. 1 and FIG. 2 illustrate various embodiments of communication systems.

LDPC (Low Density Parity Check) codes are capacity approaching forward error correcting codes (ECCs) that are being adopted in an increasing number of communication standards (e.g., IEEE 802.3an, IEEE 802.11n, 802.20, DVB-S2). Relevant application domains include magnetic recording, wireless, and high speed data transmission over copper and optical fiber.

In one embodiment, LDPC decoding processing is performed using an iterative decoding approach in which messages (e.g., check edge messages and bit edge messages [or alternatively referred to as "variable edge messages"]) are passed back and forth when performing check node processing (sometimes alternatively referred to as check engine processing) and bit node processing (sometimes alternatively referred to as bit engine processing). This is sometimes refereed to as message passing decoding processing that operates on a graph representation of the code (e.g., a LDPC bipartite graph (also sometimes referred to as a "Tanner" graph in the art)).

One of the key hardware implementation challenges is the management of the large number of messages that must be exchanged during each decoder iteration. Herein, various approaches are presented that allow for a reduction in the memory requirement, certain hardware requirements (e.g., no requirement for a barrel shifter or any large fan-in multiplexer (MUX), or large memory such as RAM (Random Access Memory) as is oftentimes used to store the check edge messages and bit edge messages). In addition, the novel means for performing decoding processing performed in accordance with various aspects of the invention also provides for a high throughput. Instead, a novel means of employing one or more daisy chains each having appropriately placed registers and only localized MUXs (e.g., MUXs with merely 2 inputs each) operate to perform the appropriate shifting and alignment of the check edge messages and bit edge messages for check node processing and bit node processing, respectively. In some embodiments, the means presented herein capitalizes upon the fact that a low density parity check matrix, H, of the LDPC code is composed of sub-matrices. For example, sub-matrix-based processing can be employed when processing the low density parity check matrix, H, and this characteristic of the low density parity check matrix, H, (e.g., being composed of sub-matrices) can be exploited to provide for improved architectures and efficiencies.

Within each daisy chain, each register stores a bit edge message or a check edge message at any given time, and the MUXs operate to select which of the bit edge messages or check edge messages are going to be updated during a given processing time. It is also noted that the "daisy chain" configuration employed herein differs from a traditional daisy chain, in that, the are includes MUXs that are operable to enable updating of firstly the bit edge messages and secondly the check edge messages, or vice versa, using the very same daisy chain at different times. The connectivity of when the one or more bit engines and one or more check engines couple to the daisy chain is based on the locations of non-null elements within the low density parity check matrix, H. In other words, from certain perspectives, the hard-wired connectivity of the daisy chain corresponds to the low density parity check matrix, H.

Also, generally speaking, when decoding on a sub-matrix based basis, the means presented herein can employ "N" bit engines, and "M" check engines when each sub-matrix has a size of "X×X", such that each of X/M and X/N each form a first and/or second integer value. In other words, the number of bit engines employed need not be the same as the number of check engines employed.

Alternatively, if these conditions are not met (e.g., one or both of X/M and X/N forms a non-integer value), then there may be one or more some bit engines and/or check engines are idle when performing bit node processing or check node processing, respectively; nevertheless, the means presented herein using a daisy chain can still be employed.

The novel means presented herein includes an LDPC decoding architecture leveraging a distributed processing technique (e.g., daisy chain) to increase data throughput and reduce memory storage requirements. Routing congestion and critical path latency are also improved in this novel design. The novel decoding means presented herein can also be applied to LDPC codes operating on a low density parity check matrix, H, consisting of circularly shifted identity matrix sub-blocks. In some embodiments, the entire low density parity check matrix, H, is broken into square sub-matrices such that each sub-matrix consists of either a CSI (Cyclic Shifted Identity) matrix or a null matrix (all zeroes). A CSI sub-matrix is generated using cyclic shifting of an identity matrix (e.g., a CSI sub-matrix can be generated by performing cyclic shifting when starting with an original sub-matrix which is an identity matrix such that all diagonal column elements, when starting in the upper left hand entry and continuing down and to the right until reaching the bottom right hand element, are all a value of "1", and all other elements therein are "0"). In the instance of when a low density parity check matrix, H, being employed to decode an LDPC coded signal includes sub-matrices having CSI format, then the CSI offset per sub-matrix should be known. The CSI offset is the cyclic shifting required from an original identity matrix that is needed to generate the CSI matrix of interest. LDPC codes whose low density parity check matrices, H, have such a structure (e.g., including CSI sub-matrices, etc.) are found in the IEEE 802.11n draft 2.02 standard and the IEEE 802.16e standard.

It is also noted that the means presented herein also is equally applicable for use in decoding LDPC coded signals whose low density parity check matrix, H, does not include sub-matrices having CSI format. In other words, the novel decoding means presented herein can accommodate any form of low density parity check matrix, H.

It is noted that any of the following embodiments and approaches described herein are applicable regardless of the overall LDPC decoder architecture, e.g., whether fully parallel, partially parallel, or serial in architecture/hardware implementation.

The goal of digital communications systems is to transmit digital data from one location, or subsystem, to another either error free or with an acceptably low error rate. As shown in FIG. 1, data may be transmitted over a variety of communications channels in a wide variety of communication systems: magnetic media, wired, wireless, fiber, copper, and other types of media as well.

Figure 2:
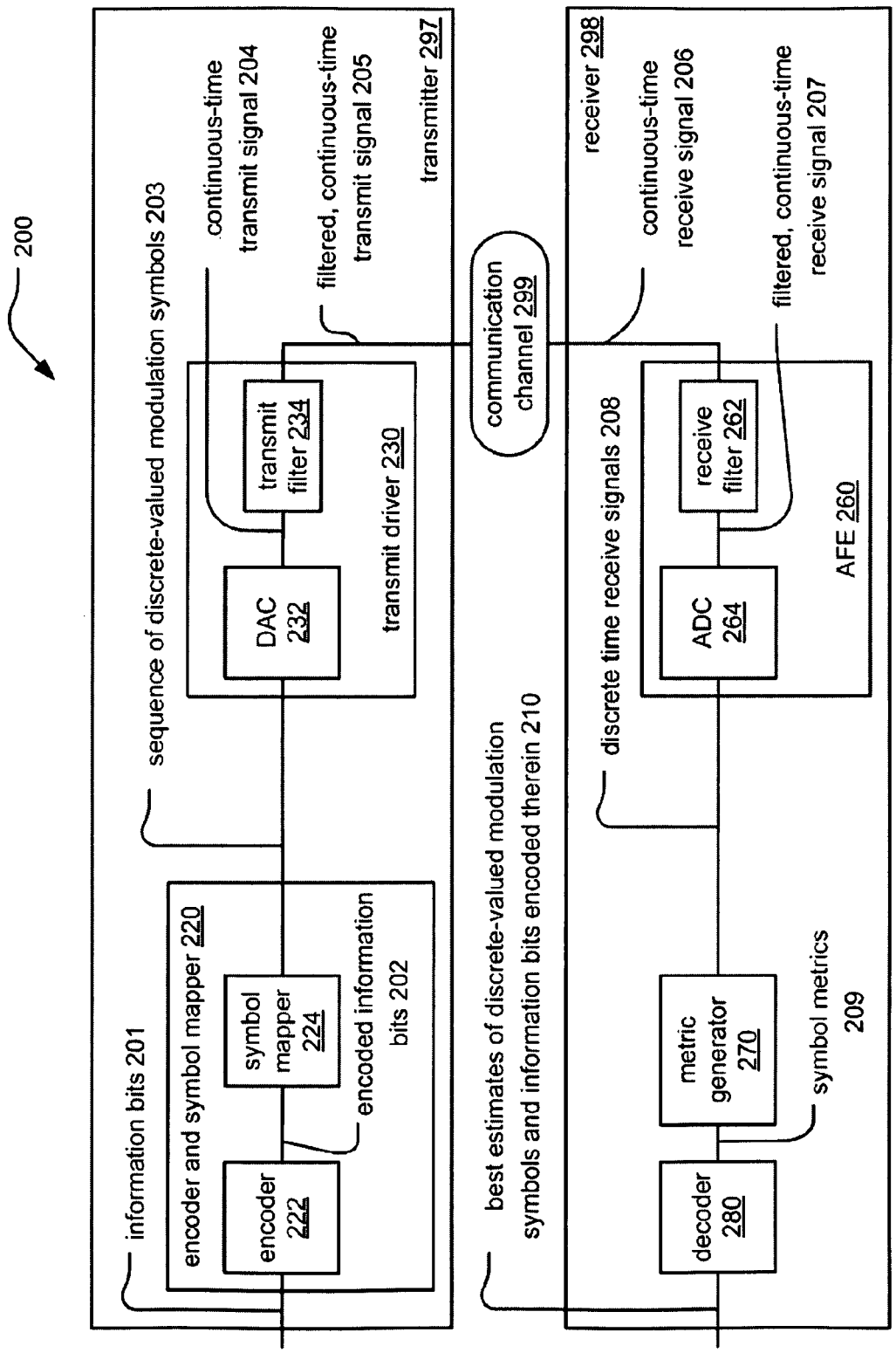

FIG. 1 and FIG. 2 are diagrams illustrate various embodiments of communication systems, 100 and 200, respectively.

Referring to FIG. 1, this embodiment of a communication system 100 is a communication channel 199 that communicatively couples a communication device 110 (including a transmitter 112 having an encoder 114 and including a receiver 116 having a decoder 118) situated at one end of the communication channel 199 to another communication device 120 (including a transmitter 126 having an encoder 128 and including a receiver 122 having a decoder 124) at the other end of the communication channel 199. In some embodiments, either of the communication devices 110 and 120 may only include a transmitter or a receiver. There are several different types of media by which the communication channel 199 may be implemented (e.g., a satellite communication channel 130 using satellite dishes 132 and 134, a wireless communication channel 140 using towers 142 and 144 and/or local antennae 152 and 154, a wired communication channel 150, and/or a fiber-optic communication channel 160 using electrical to optical (E/O) interface 162 and optical to electrical (O/E) interface 164)). In addition, more than one type of media may be implemented and interfaced together thereby forming the communication channel 199.

To reduce transmission errors that may undesirably be incurred within a communication system, error correction and channel coding schemes are often employed. Generally, these error correction and channel coding schemes involve the use of an encoder at the transmitter and a decoder at the receiver.

Referring to the communication system 200 of FIG. 2, at a transmitting end of a communication channel 299, information bits 201 are provided to a transmitter 297 that is operable to perform encoding of these information bits 201 using an encoder and symbol mapper 220 (which may be viewed as being distinct functional blocks 222 and 224, respectively) thereby generating a sequence of discrete-valued modulation symbols 203 that is provided to a transmit driver 230 that uses a DAC (Digital to Analog Converter) 232 to generate a continuous-time transmit signal 204 and a transmit filter 234 to generate a filtered, continuous-time transmit signal 205 that substantially comports with the communication channel 299. At a receiving end of the communication channel 299, continuous-time receive signal 206 is provided to an AFE (Analog Front End) 260 that includes a receive filter 262 (that generates a filtered, continuous-time receive signal 207) and an ADC (Analog to Digital Converter) 264 (that generates discrete-time receive signals 208). A metric generator 270 calculates symbol metrics 209 that are employed by a decoder 280 to make best estimates of the discrete-valued modulation symbols and information bits encoded therein 210.

The decoders of either of the previous embodiments may be implemented to include various aspects and/or embodiment of the invention therein. In addition, several of the following Figures describe other and particular embodiments (some in more detail) that may be used to support the devices, systems, functionality and/or methods that may be implemented in accordance with certain aspects and/or embodiments of the invention. One particular type of signal that is processed according to certain aspects and/or embodiments of the invention is an LDPC coded signal. Before more details are provided below, a general description of LDPC codes is provided.

Several of the following Figures describe other and particular embodiments (some in more detail) that may be used to support the devices, systems, functionality and/or methods that may be implemented in accordance with certain aspects and/or embodiments of the invention. One particular type of signal that is processed according to certain aspects and/or embodiments of the invention is an LDPC coded signal. Before more details are provided below, a general description of LDPC codes is provided.

Figure 3:
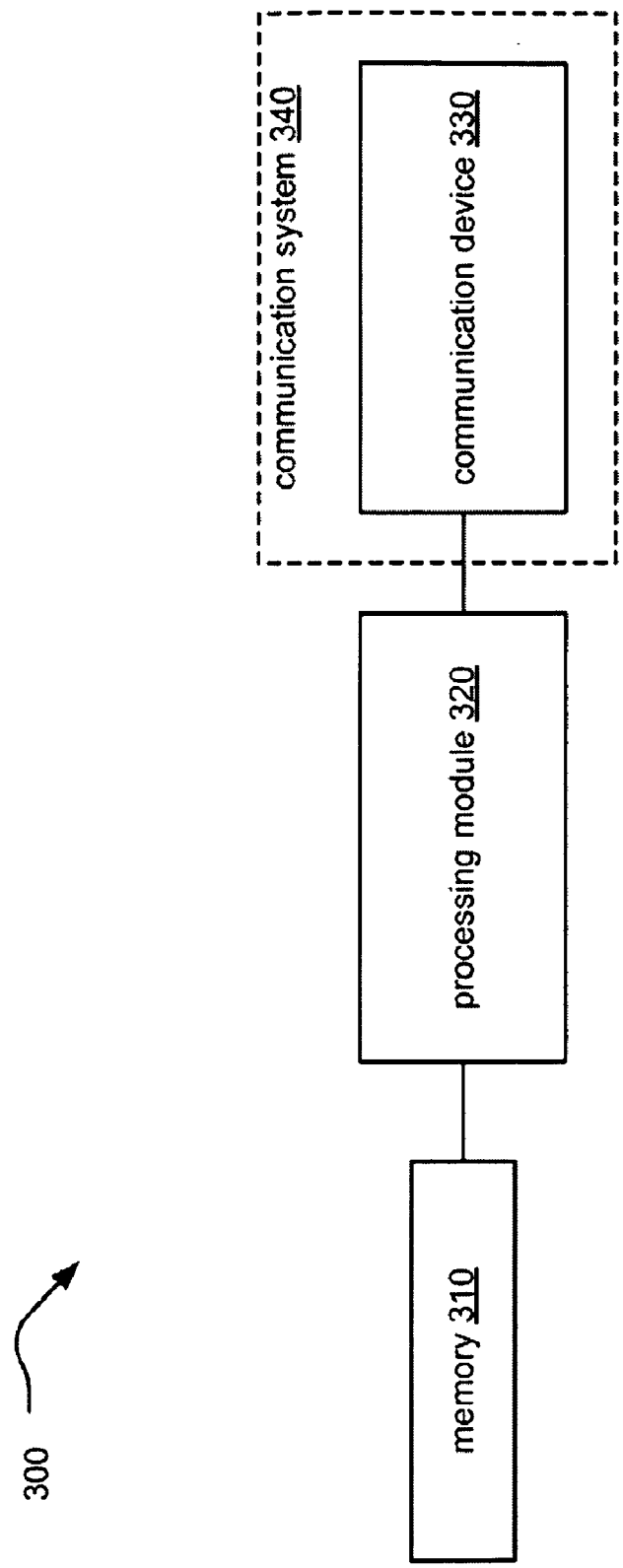
FIG. 3 illustrates an embodiment of an apparatus that is operable to perform LDPC decoding processing.

FIG. 3 illustrates an embodiment of an apparatus 300 that is operable to perform LDPC decoding processing. The apparatus 300 includes a processing module 320, and a memory 310. The memory 310 is coupled to the processing module, and the memory 310 is operable to store operational instructions that enable the processing module 320 to perform a variety of functions. The processing module 320 is operable to perform and/or direct the manner in which LDPC decoding processing is to be performed in accordance with any embodiment described herein, or any equivalent thereof.

The processing module 320 can be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 310 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 320 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

If desired in some embodiments, the manner in which the LDPC decoding processing is to be performed (e.g., including the connectivity of the daisy chain or selection of an appropriate connected daisy chain in an embodiment that includes more than 1 daisy chain configuration therein to enable decoding of more than 1 LDPC code by a communication device) can be provided from the apparatus 300 to a communication system 340 that is operable to employ and perform LDPC coding using a desired LDPC code. For example, information corresponding to the LDPC code being used (e.g., the parity check matrix of the LDPC code) can also be provided from the processing module 320 to any of a variety of communication devices 330 implemented within the communication system 340 as well. In addition, the manner in which such LDPC decoding is to be performed within any of a variety of communication devices 330 implemented within the communication system 340 can also be provided from the processing module 320.

If desired, the apparatus 320 can be designed to generate multiple means of performing LDPC decoding in accordance with multiple needs and/or desires as well. In some embodiments, the processing module 320 can selectively provide different information (e.g., corresponding to different LDPC codes, etc.) to different communication devices and/or communication systems. That way, different communication links between different communication devices can employ different LDPC codes and/or means by which to perform LDPC decoding. Clearly, the processing module 320 can also provide the same information to each of different communication devices and/or communication systems as well without departing from the scope and spirit of the invention.

Figure 4:
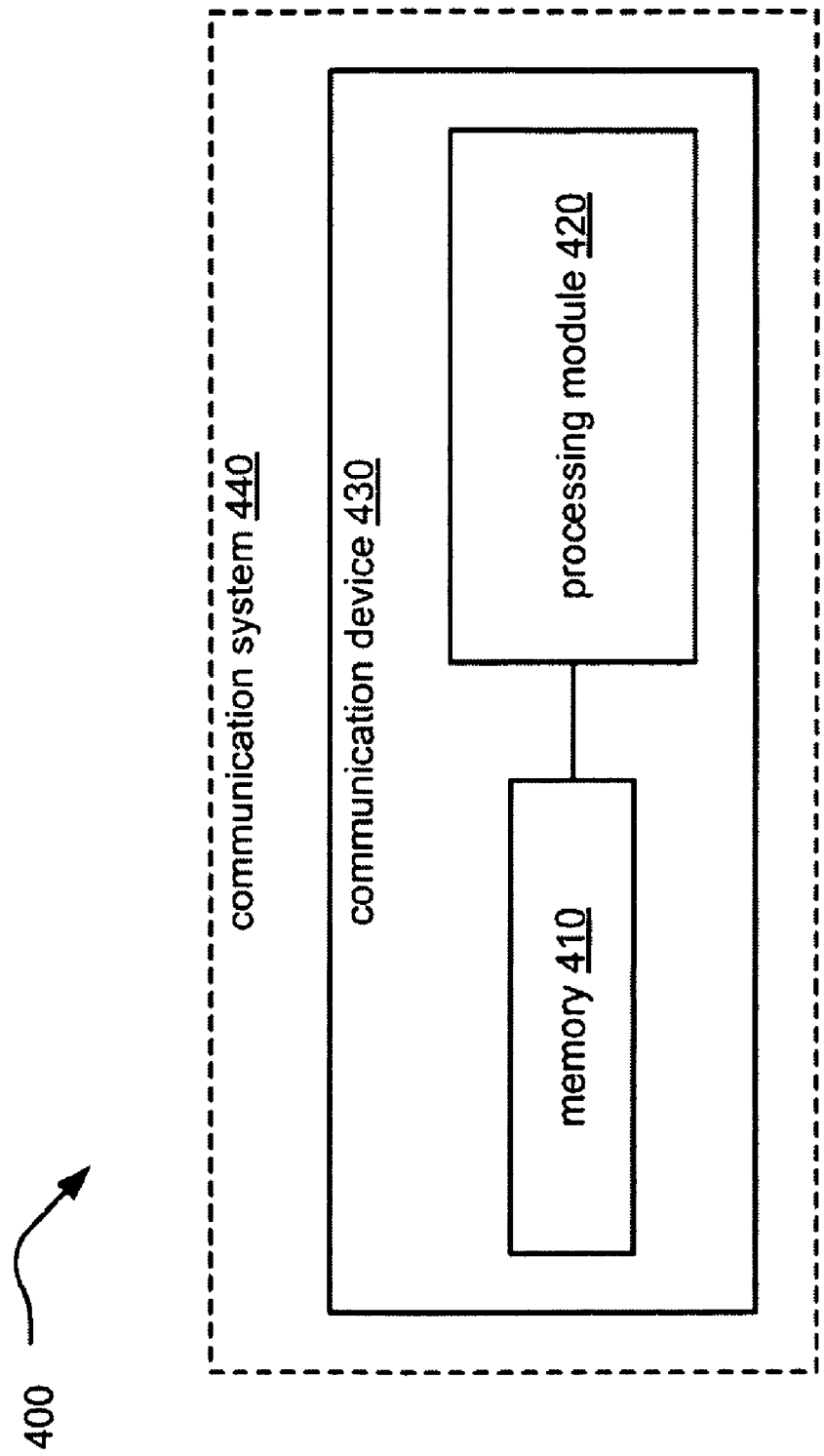
FIG. 4 illustrates an alternative embodiment of an apparatus that is operable to perform LDPC decoding processing.

FIG. 4 illustrates an alternative embodiment of an apparatus 400 that is operable to perform LDPC decoding processing. The apparatus 400 includes a processing module 420, and a memory 410. The memory 410 is coupled to the processing module, and the memory 410 is operable to store operational instructions that enable the processing module 420 to perform a variety of functions. The processing module 420 (serviced by the memory 420) can be implemented as an apparatus capable to perform any of the functionality of any of the various modules and/or functional blocks described herein. For example, the processing module 420 (serviced by the memory 420) can be implemented as an apparatus capable to perform and/or direct the manner in which LDPC decoding processing is to be performed in accordance with any embodiment described herein, or any equivalent thereof.

The processing module 420 can be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 410 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 420 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

If desired in some embodiments, the apparatus 400 can be any of a variety of communication devices 430, or any part or portion of any such communication device 430. Any such communication device that includes the processing module 420 and/or memory 410 can be implemented within any of a variety of communication systems 440 as well. It is also noted that various embodiments of LDPC decoding processing in accordance with LDPC decoding processing as presented herein, and equivalents thereof, may be applied to many types of communication systems and/or communication devices.

Figure 5:
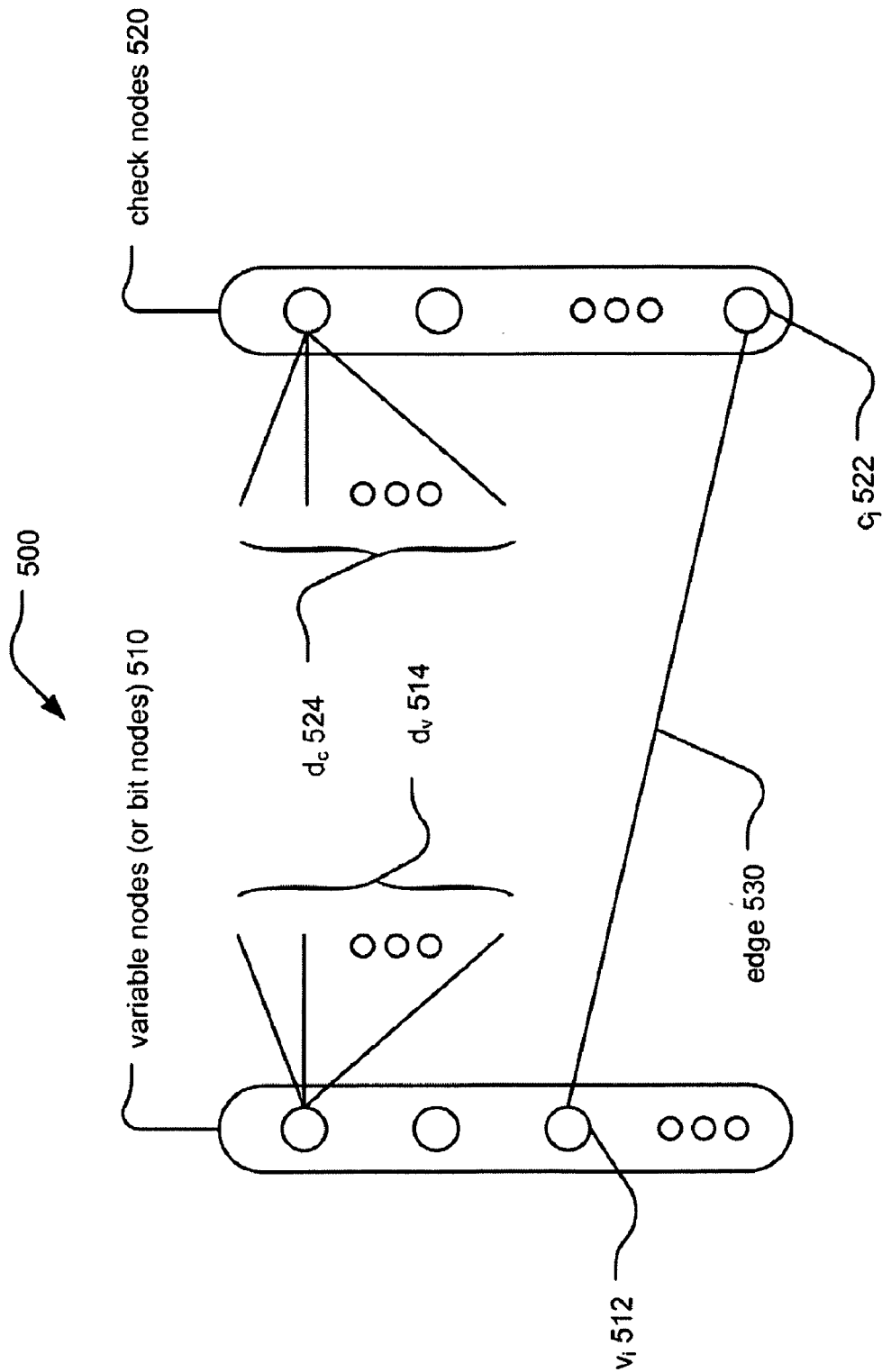
FIG. 5 illustrates an embodiment of an LDPC (Low Density Parity Check) code bipartite graph.

FIG. 5 illustrates an embodiment of an LDPC (Low Density Parity Check) code bipartite graph 500. In the art, an LDPC bipartite graph may also sometimes be referred to as a "Tanner" graph. An LDPC code may be viewed as being a code having a binary parity check matrix such that nearly all of the elements of the matrix have values of zeroes (e.g., the binary parity check matrix is sparse). For example, $H=(h_{i,j})_{M \times N}$ may be viewed as being a parity check matrix of an LDPC code with block length N.

LDPC codes are linear block codes and hence the set of all codewords $x \in C$ spans the null space of a parity check matrix, H.

$$Hx^T=0, \forall x \alpha C \quad (1)$$

For LDPC codes, H, is a sparse binary matrix of dimension m×n. Each row of H corresponds to a parity check and a set element $h_{ij}$ indicates that data symbol j participates in parity check i. Each column of H corresponds to a codeword symbol.

For each codeword x there are n symbols of which m are parity symbols. Hence the code rate r is given by:

$$r=(n-m)/n \quad (2)$$

The row and column weights are defined as the number of set elements in a given row or column of H, respectively. The set elements of H are chosen to satisfy the performance requirements of the code. The number of 1's in the i-th column of the parity check matrix, H, may be denoted as $d_v(i)$, and the number of 1's in the j-th row of the parity check matrix may be denoted as $d_c(j)$. If $d_v(i)=d_v$ for all i, and $d_c(J)=d_c$ for all j, then the LDPC code is called a $(d_v,d_c)$ regular LDPC code, otherwise the LDPC code is called an irregular LDPC code.

LDPC codes were introduced by R. Gallager in [1] referenced below (also in [2] referenced below) and by M. Luby et al. in [3] also referenced below.

[1] R. Gallager, *Low-Density Parity-Check Codes*, Cambridge, Mass.: MIT Press, 1963.

[2] R. G. Gallager, "Low density parity check codes," *IRE Trans. Info. Theory*, vol. IT-8, January 1962, pp. 21-28.

[3] M. G. Luby, M. Mitzenmacher, M. A. Shokrollahi, D. A. Spielman, and V. Stemann, "Practical Loss-Resilient Codes", *Proc. 29th Symp. on Theory of Computing*, 1997, pp. 150-159.

A regular LDPC code can be represented as a bipartite graph 500 by its parity check matrix with left side nodes representing variable of the code bits (or alternatively as the "variable nodes" (or "bit nodes") 510 in a bit decoding approach to decoding LDPC coded signals), and the right side nodes representing check equations (or alternatively as the "check nodes" 520). The bipartite graph 500 (or sometimes referred to as a Tanner graph 500) of the LDPC code defined by H may be defined by N variable nodes (e.g., N bit nodes) and M check nodes. Every variable node of the N variable nodes 510 has exactly $d_v(i)$ edges (an example edge shown using reference numeral 530) connecting the bit node, $v_i$ 512, to one or more of the check nodes (within the M check nodes). The edge 530 is specifically shown as connecting from the bit node, $v_i$ 512, to the check node, $c_j$ 522. This number of $d_v$ edges (shown as $d_v$ 514) may be referred to as the degree of a variable node i. Analogously, every check node of the M check nodes 520 has exactly $d_c(j)$ edges (shown as $d_c$ 524) connecting this node to one or more of the variable nodes (or bit nodes) 510. This number of edges, $d_c$, may be referred to as the degree of the check node j.

An edge 530 between a variable node $v_i$ (or bit node $b_i$) 512 and check node $c_j$ 522 may be defined by e=(i,j). However, on the other hand, given an edge e=(i,j), the nodes of the edge may alternatively be denoted as by e=(v(e),c(e)) (or e=(b(e), c(e))). Alternatively, the edges in the graph correspond to the set elements of H where a set element $h_{ij}$ indicates that an edge connects a bit (e.g., variable) node i with parity check node j.

Given a variable node $v_i$ (or bit node $b_i$), one may define the set of edges emitting from the node $v_i$ (or bit node $h_i$) by $E_v(i)=\{e|v(e)=i\}$ (or by $E_b(i)=\{e|b(e)=i\}$); these edges are referred to as bit edges, and the messages corresponding to these bit edges are referred to as bit edge messages.

Given a check node $c_j$, one may define the set of edges emitting from the node $c_j$ by $E_c(j)=\{e|c(e)=j\}$; these edges are referred to as check edges, and the messages corresponding to these check edges are referred to as check edge messages. Continuing on, the derivative result will be $|E_v(i)|=d_v$ (or $|E_b(i)|=d_b$) and $|E_c(j)|=d_c$.

Generally speaking, any codes that can be represented by a bipartite graph may be characterized as a graph code. It is also noted that an irregular LDPC code may also described using a bipartite graph. However, the degree of each set of nodes within an irregular LDPC code may be chosen according to some distribution. Therefore, for two different variable nodes, $v_{i_1}$ and $v_{i_2}$, of an irregular LDPC code, $|E_v(i_1)|$ may not equal to $|E_v(i_2)|$. This relationship may also hold true for two check nodes. The concept of irregular LDPC codes was originally introduced within M. Luby et al. in [3] referenced above.

In general, with a graph of an LDPC code, the parameters of an LDPC code can be defined by a degree of distribution, as described within M. Luby et al. in [3] referenced above and also within the following reference [4]:

[4] T. J. Richardson and R. L. Urbanke, "The capacity of low-density parity-check code under message-passing decoding," *IEEE Trans. Inform. Theory*, Vol. 47, No. 2, February 2001, pp. 599-618.

This distribution may be described as follows:

Let $\lambda_i$ represent the fraction of edges emanating from variable nodes of degree i and let $\rho_i$ represent the fraction of edges emanating from check nodes of degree i. Then, a degree distribution pair $(\lambda, \rho)$ is defined as follows:

$$\lambda(x) = \sum_{i=2}^{M_v} \lambda_i x^{i-1} \text{ and } \rho(x) = \sum_{i=2}^{M_c} \rho_i x^{i-1},$$

where $M_v$ and $M_c$ represent the maximal degrees for variable nodes and check nodes, respectively.

While many of the illustrative embodiments described herein utilize regular LDPC code examples, it is noted that certain aspects and/or embodiments of the invention are also operable to accommodate both regular LDPC codes and irregular LDPC codes.

It is also noted that many of the embodiments described herein employ the terminology of "bit node" and "bit edge message", or equivalents thereof. Oftentimes, in the art of LDPC decoding, the "bit node" and "bit edge message" are alternatively referred to as "variable node" and "variable edge message", in that, the bit values (or variable values) are those which are attempted to be estimated. Either terminology can be employed in accordance with certain aspects of the invention.

The novel decoding means presented herein can be implemented in accordance with the belief propagation algorithm of decoding LDPC coded signals (or sometimes alternatively referred to as belief propagation decoding processing). The belief propagation algorithm consists of iteratively updating the probability value of each bit using the parity check equations that the bit participates in (as described above in reference [1] of R. Gallager, 1963). This algorithm is also sometimes alternatively referred to as "message-passing decoding" (or message passing decoding processing) because intrinsic information is passed as messages between the check nodes and the bit nodes (as described above in reference [4] of Richardson and Urbanke, 2001]. The check nodes correspond to rows in the low density parity check matrix, H, the bit nodes correspond to the columns. Thus, an iteration of the belief propagation algorithm would consist of check node updates on all the rows followed by bit node updates on all the columns.

Figure 6:
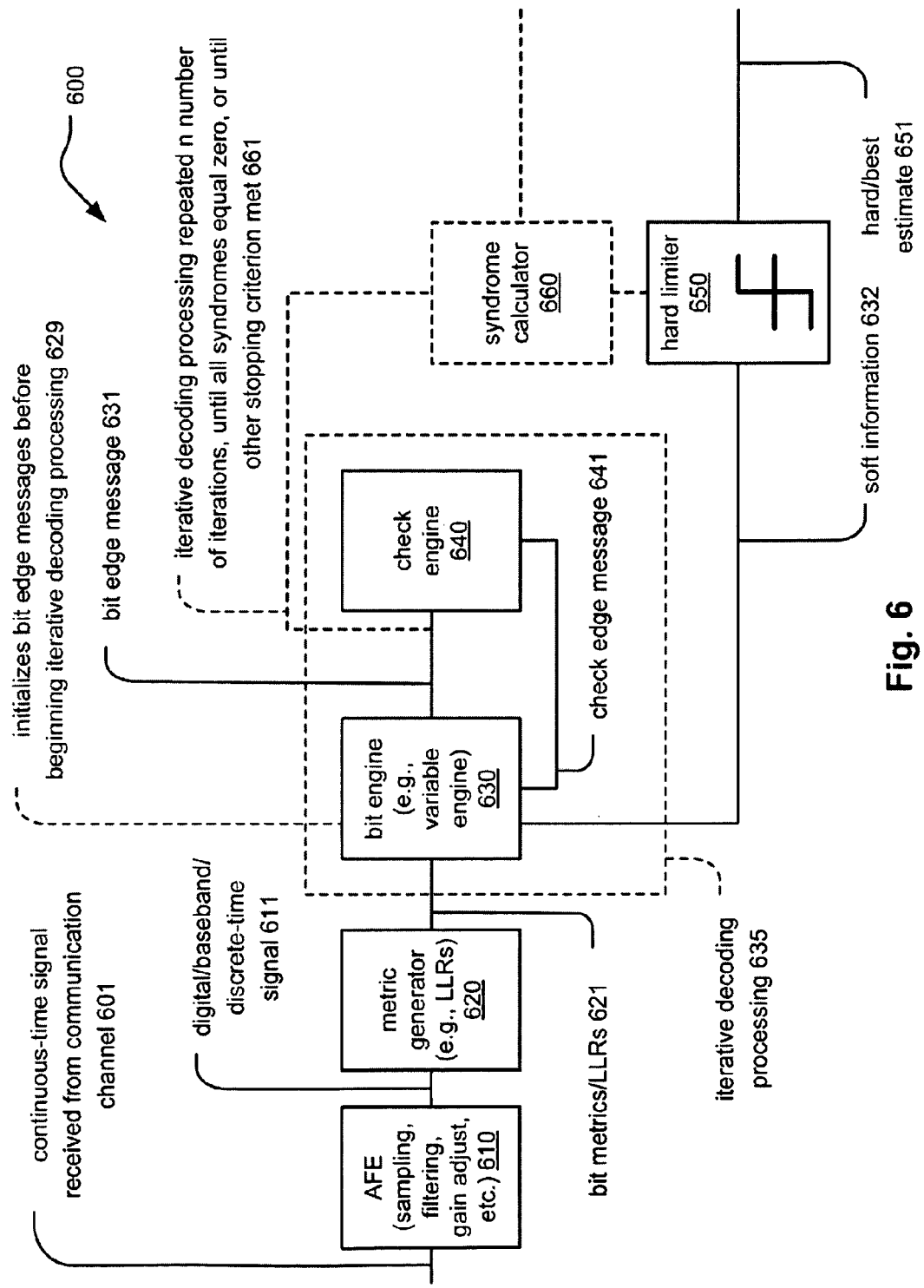
FIG. 6 illustrates an embodiment of LDPC decoding functionality.

FIG. 6 illustrates an embodiment of LDPC decoding functionality 600. To perform decoding of an LDPC coded signal having an m-bit signal sequence, the functionality of this diagram may be employed. Generally speaking, a continuous-time signal is received from a communication channel, as shown by reference numeral 601. The communication channel can be any type of channel including, though not limited to, a wireline communication channel, a wireless communication channel, a fiber-optic communication channel, a read channel of a HDD, or other type of communication channel capable to carrying a continuous-time signal that has been coded using an LDPC code.

An analog front-end (AFE) 610 is operable to perform any initial processing on the continuous-time signal (e.g., by performing any one or more of filtering (analog and/or digital filtering), gain adjustment, etc.) and digital sampling thereby a discrete-time signal 611. This discrete-time signal 611 can alternatively be referred to as a digital signal, a baseband signal, or other appropriate terminology known in the art. Oftentimes, the discrete-time signal 611 is partitioned into I, Q (In-phase, Quadrature) values of the signal.

A metric generator 620 is operable to receive the discrete-time signal 611 (e.g., which can include the I, Q values thereof) and to calculate the corresponding bit metrics and/or log likelihood ratios (LLRs) 621 that correspond to the received values within the discrete-time signal 611. In some embodiments, the calculation of these bit metrics/LLRs symbol metrics 621 is a two-step process, in which, the metric generator 620 firstly is operable to calculate symbol metrics corresponding to the symbols of the discrete-time signal 611, an then the metric generator secondly is operable to employ the symbol metrics to decompose those symbol metrics into the bit metrics/LLRs 621. These bit metrics/LLRs 621 are then employed by a bit engine 630 to initialize the bit edge messages (e.g., as shown by reference numeral 629) that are employed when performing iterative decoding processing 635 (e.g., as performed by the bit engine 630 and a check engine 640) of the LDPC coded signal.

The initialization of the bit edge messages for each variable node i with the value of the log-likelihood ratio (LLR), $\lambda_i$, of the corresponding received symbol, $y_i$, defined as follows:

$$\lambda_i = \ln\left[\frac{Pr(x_i = 0 \mid y_i)}{Pr(x_i = 1 \mid y_i)}\right] \quad (3)$$

Also, at the bit nodes, a bit engine 630 is operable to compute the corresponding soft information of the bits (e.g., shown as soft information 632) using the most recently updated bit edge messages. However, it is common for multiple decoding iterations to be performed, so the initialized bit edge messages are passed to the check engine 640 where, during a first decoding iteration, the check engine 640 is operable to employ the initialized bit edge messages to update check edge messages.

At each check node, the LDPC decoding processing forms a parity check result (XOR) on the sign of the incoming messages. This operates by finding the sign of each outgoing message as the XOR of the sign of the corresponding incoming message with the parity check result.

The decoding processing then calculates the outgoing message reliability from check node j to the bit (e.g., variable) node i according to:

$$\lambda_{ji} = 2\tanh^{-1}\left(\prod_{k,h_{jk}=1,k\neq i} \tanh\left(\frac{\lambda_{jk}}{2}\right)\right) \quad (4)$$

In some desired embodiments, this calculation is performed in the log domain to transform the multiplication into a sum as follows:

$$\lambda_{ji} = 2\tanh^{-1}\left(\exp\left\{\sum_{k,h_{jk}=1,k\neq i} \log\left(\tanh\left(\frac{\lambda_{jk}}{2}\right)\right)\right\}\right) \quad (5)$$

Thereafter, the bit engine 630 is operable to receive the updated edge messages (e.g., shown as check edge message 641) from the check engine 640 and to employ them to update the bit edge messages. Also, the bit engine 630 is operable to employ the bit metrics/LLRs 621 that are received from the metric generator 620 when performing the updating of the bit edge messages in accordance with LDPC decoding. Also, these updated check edge messages 641 are then passed back to the bit nodes (e.g., to the bit engine 630) where the soft information 632 of the bits is calculated using the bit metrics/LLRs 621 and the current iteration values of the check edge messages. At each bit (e.g., variable) node, the calculation of the soft information involves forming the sum of the LLR of the received symbol with the incoming messages from the check node (e.g., the check edge messages 641). The decoded bit $\hat{x}_i$ is given by the sign of the summation. Each outgoing message for the next decoder iteration is computed by subtracting the corresponding incoming message from the summation. To continue with the iterative decoding processing 635, these bit edge messages 631, after being updated, are then passed to the check engine 640.

Another decoding iteration can be performed, in that, at the check nodes, the check engine 640 is then operable to receive these updated bit edge messages 631 sent from the bit nodes (e.g., from the bit engine 630) and updates the check edge messages accordingly. These updated check edge messages 641 are then passed back to the bit nodes (e.g., to the bit engine 630) where the soft information 632 of the bits is calculated using the bit metrics/LLRs 621 and the current iteration values of the check edge messages. Thereafter, using this just calculated soft information 632 of the bits, the bit engine 630 again is operable to update the bit edge messages using the previous values of the check edge messages (from the just previous iteration). The iterative processing 635 continues between the bit nodes and the check nodes according to the LDPC code bipartite graph that was employed to encode the signal that is being decoded.

These iterative decoding processing steps, performed by the bit node engine 630 and the check node engine 640, are repeated until a stopping criterion is met as shown by reference numeral 661 (e.g., after a predetermined or adaptively determined number of iterations have been performed, after all syndromes of the LDPC code are all equal to zero (e.g., all of the parity checks are satisfied), and/or other stopping criterion has been met). Another possible means by which LDPC decoding can be stopped is when the current estimate of the LDPC codeword, x, satisfies the following relationship:

$$H\hat{x}^T = 0$$

Soft information 632 can be generated within the bit engine 630 during each of the decoding iterations. In this embodiment, this soft information 632 may be provided to a hard limiter 650 where hard decisions may be made, and that hard information (e.g., hard/best estimate 651) may be provided to a syndrome calculator 660 that is operable to determine whether the syndromes of the LDPC code are all equal to zero. That is to say, the syndrome calculator 660 is operable to determine whether each syndrome associated with the LDPC code is equal to zero, based on the current estimate of the LDPC codeword.

When the syndromes are not equal to zero, the iterative decoding processing 635 can continue again by appropriately updating and passing the bit edge messages and the check edge messages between the bit engine 630 and the check engine 640, respectively. After all of these iterative decoding processing steps have been performed, then the hard/best estimates 651 of the bits are output based on the soft information 632.

Figure 7:
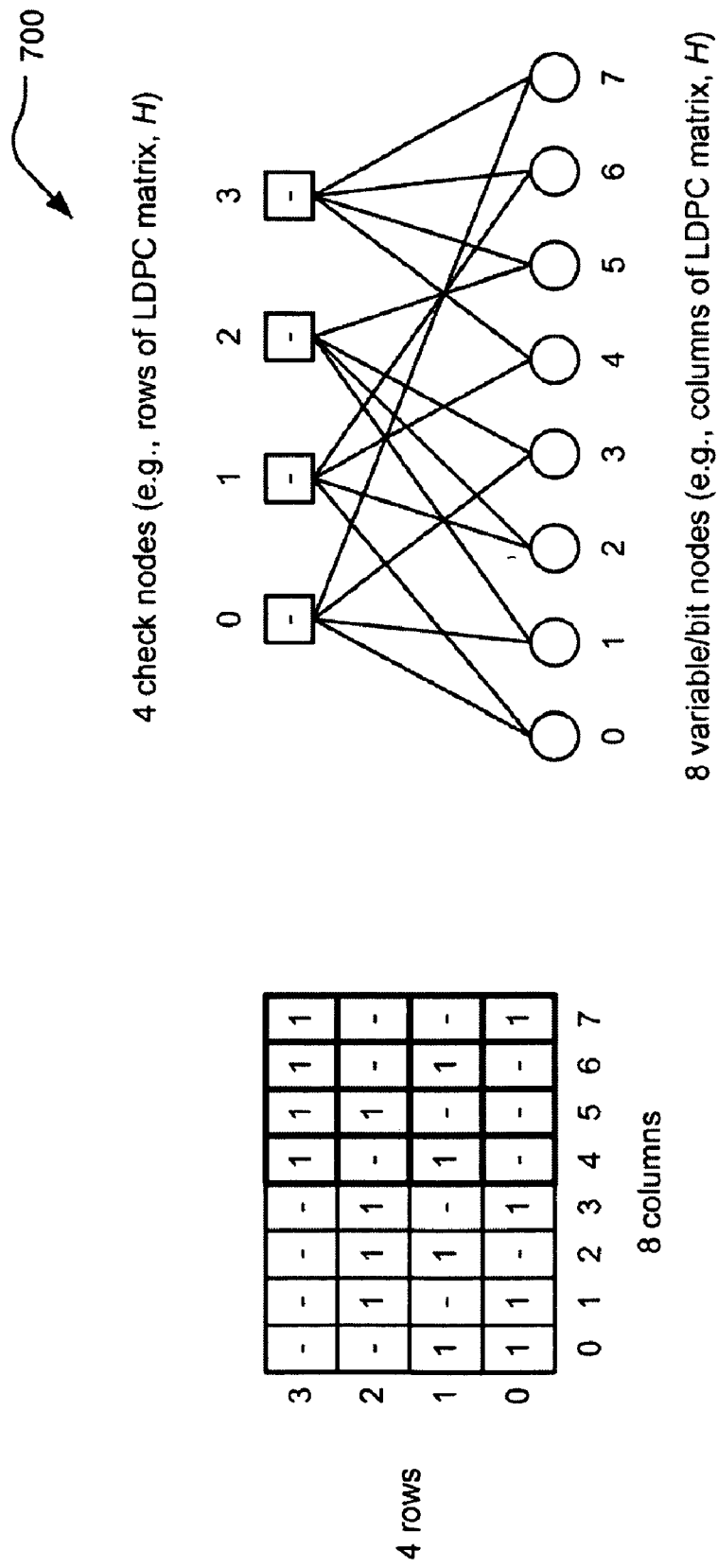
FIG. 7 illustrates an embodiment of a message passing decoding processing or belief propagation decoding processing and the relationships between check node, bit nodes, and rows and columns of an low density parity check matrix, H.

FIG. 7 illustrates an embodiment of a message passing decoding processing or belief propagation decoding processing 700 and the relationships between check node, bit nodes, and rows and columns of a low density parity check matrix, H. This particular low density parity check matrix, H, includes 4 rows and 8 columns. The rows of the low density parity check matrix, H, correspond to the check nodes of the LDPC bipartite graph that represents this particular LDPC code, and the columns of the low density parity check matrix, H, correspond to the bit nodes (or variable nodes) of the LDPC bipartite graph that represents this particular LDPC code. As can be seen on the left hand side of the diagram, the low density parity check matrix, H, includes non-null elements (i.e., value of "1") and null elements (i.e., value of "0") therein. For each decoding iteration, edge messages are passed between processing modules (e.g., one or more bit engines to one or more check engines, and vice versa) in accordance with the edge connectivity of the LDPC bipartite graph.

As can be seen, the non-null elements in the low density parity check matrix, H, correspond to the edges of the LDPC bipartite graph that selectively interconnect certain of the check nodes to certain of the bit nodes.

Each check node update can be performed with any of several possible computations, including sum-product, min-sum (reference [5] cited below by Anastasopoulos, 2001), modified min-sum (reference [6] cited below by Karkooti, et al., 2004), and BCJR (reference [7] cited below by Mansour, et al. 2002). The computation is chosen depending on the area and latency budget allocated to the check node update. The distributed processing LDPC decoder can use any of the possible check node updates depending on the specific application.

[5] Anastasopoulos, A., "A comparison between the sum-product and the min-sum iterative detection algorithms based on density evolution", *IEEE Global Telecommunications Conference*, Vol. 2, No. 25-29, November 2001, pp. 1021-1025.

[6] Karkooti, M., and Cavallaro, J. R., "Semi-Parallel Reconfigurable Architectures for Real-Time LDPC Decoding", *Proceedings of the International Conference on Information Technology: Coding and Computing*, Vol. 1, 2004, pp. 579-585.

[7] Mansour, M. M., and Shanbhag, N. R., "Low-Power VLSI Decoder Architectures for LDPC Codes", *Proceedings of the 2002 International Symposium on Low Power Electronics and Design*, 2002, pp. 284-289.

Also, it is noted that for good decoding performance, it is important that the lengths of cycles in the graph are as long as possible. Short cycles, such as the length 4 cycle, can possibly degrade the performance of the message passing decoding approach to decoding an LDPC coded signal.

While the mathematics of the message passing decoding approach contains hyperbolic and logarithmic functions (e.g., see equation (5) above), in a hardware implementation these functions can alternatively be approximated by look-up tables (LUTs) or directly instantiated in logic gates. The arithmetic computation involves only additions, subtractions, and XOR operations. The number of bits required in fixed point implementation is determined by the required coding performance, speed of decoder convergence, and whether an error floor must be suppressed as described in reference [8] cited below by Zhang, et al. 2001.

[8] Zhang, T., Wang, Z., and Parhi, K., "On finite precision implementation of low density parity check codes decoder," *Proceedings of ISCAS*, Sydney, Australia, May 2001, pp. 202-205.

The novel decoding means presented herein employs a distributed processing LDPC decoder that uses a daisy chain of registers in each non-null sub-block location. These registers serve as the memory structure for both check messages and bit messages. This is different from existing RAM-based decoders which contain a RAM for every bit node as well as every check node as described in reference [9] cited below by Mansour, et al. 2003.

[9] Mansour, M. M., and Shanbhag, N. R., "High-Throughput LDPC Decoders", IEEE Transactions on Very Large Scale Integration Systems", Vol. 11, No. 6, December 2003, pp. 976-996.

The novel daisy chain approach presented herein also differs from the fully parallel architecture where every connection from check node to bit node as well as from bit node to check node is instantiated with a wire and register as described in reference [10] cited below by Blanksby, et al. 2002.

[10] Andrew J. Blanksby and Chris J. Howland, "A 690-mW 1-Gb/s 1024-b, rate-½ low-density parity-check code decoder", *IEEE Journal of Solid-State Circuits*, Vol. 37, No. 3, March 2002, pp. 404-412.

In the distributed processing LDPC decoder described herein, the daisy chain of registers (and appropriately placed MUXs) is operable to shift the data by one location instead of incrementing the RAM address (as employed in prior art approaches).

Each daisy chain is connected to at least one check node and at least one bit node. A connection consists of a wire from a daisy chain register to the node input as well as a write-back path from the node output into the subsequent daisy chain register. Multiple check nodes and/or bit nodes may be connected to the same daisy chain to increase the throughput of the decoder.

Figure 8:
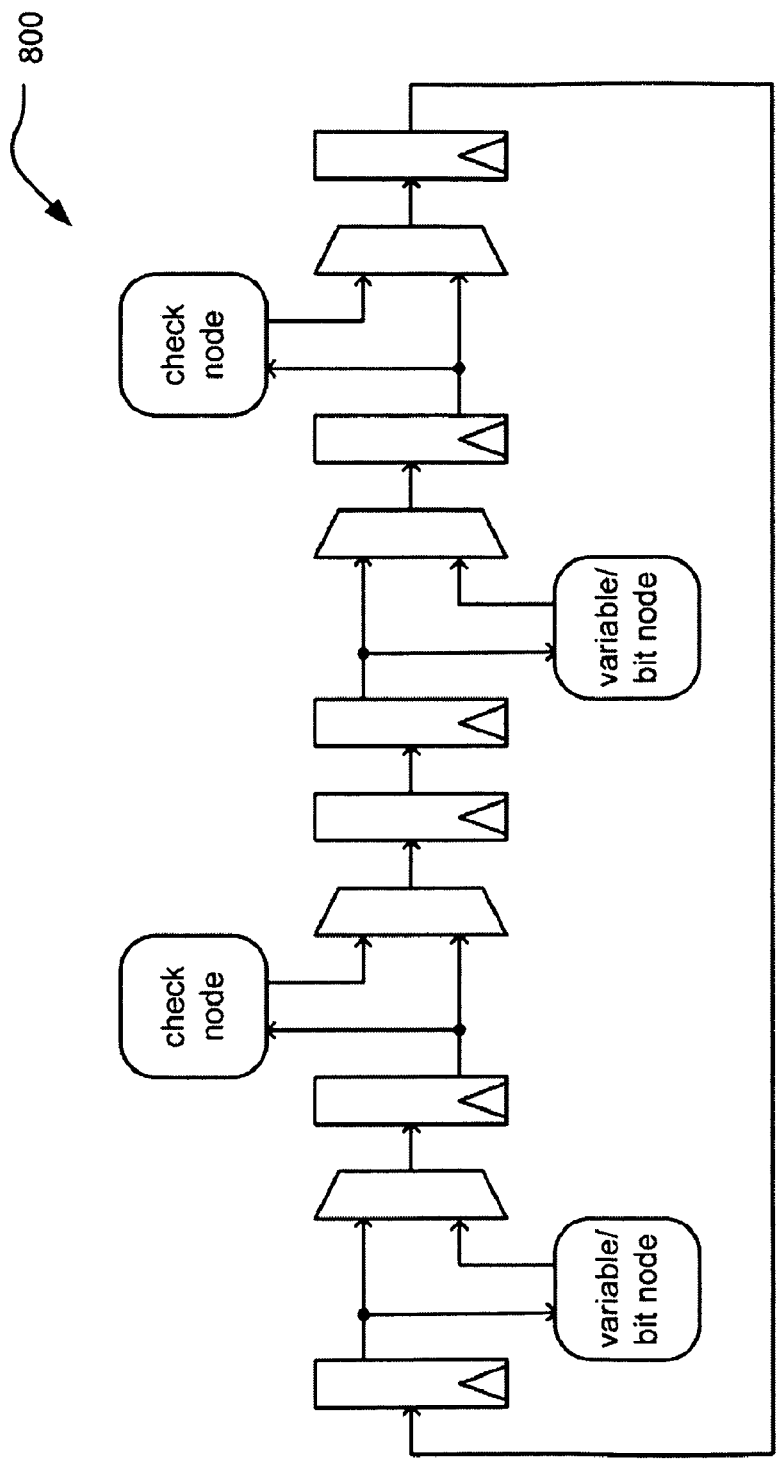
FIG. 8 illustrates an embodiment of a daisy chain architecture that is operable to perform decoding of an LDPC coded signal.

FIG. 8 illustrates an embodiment of a daisy chain architecture 800 that is operable to perform decoding of an LDPC coded signal. When considering FIG. 8, this particular embodiment of a daisy chain (which included 6 registers, 4 MUXs, and, 2 bit engines and 2 check engines) for a sub-block size of 6 with two parallel check nodes and two parallel bit nodes. The MUXs control whether the check nodes are active (e.g., during check node processing) or the bit nodes are active (e.g., during bit node processing).

During a decoding iteration, the check node updates will first be activated and the bit nodes deactivated. Check node updating/check node processing will commence and continue until the entire daisy chain is filled with check edge messages. At this point, the check node updating/check node processing phase will cease and the bit node updating/bit node processing phase will commence. Similarly, bit node updating/bit node processing will occur until the entire daisy chain memory structure is filled with bit edge messages. This process continues until the codeword passes syndrome check, a maximum iteration count is reached, or one or more other stopping criterion/criteria is/are met.

The connections between the daisy chain registers to the check nodes and bit nodes remain static because the data is rotating around the daisy chain. This eliminates any external data shifting while allowing any degree of parallelism in both the check nodes and the bit nodes. Check nodes and bit nodes could theoretically be added between every pair of registers, thus creating a fully parallel decoder.

When more than one check node and/or bit node is used per memory, the distributed processing LDPC decoder falls into a class of LDPC decoders referred to as semi-parallel architectures (e.g., see reference [6] cited above by Karkooti, et al., 2004)). Such a decoder has the advantage of improved throughput over a serial architecture yet does not suffer the routing and area penalties of a fully parallel decoder.

Figure 9:
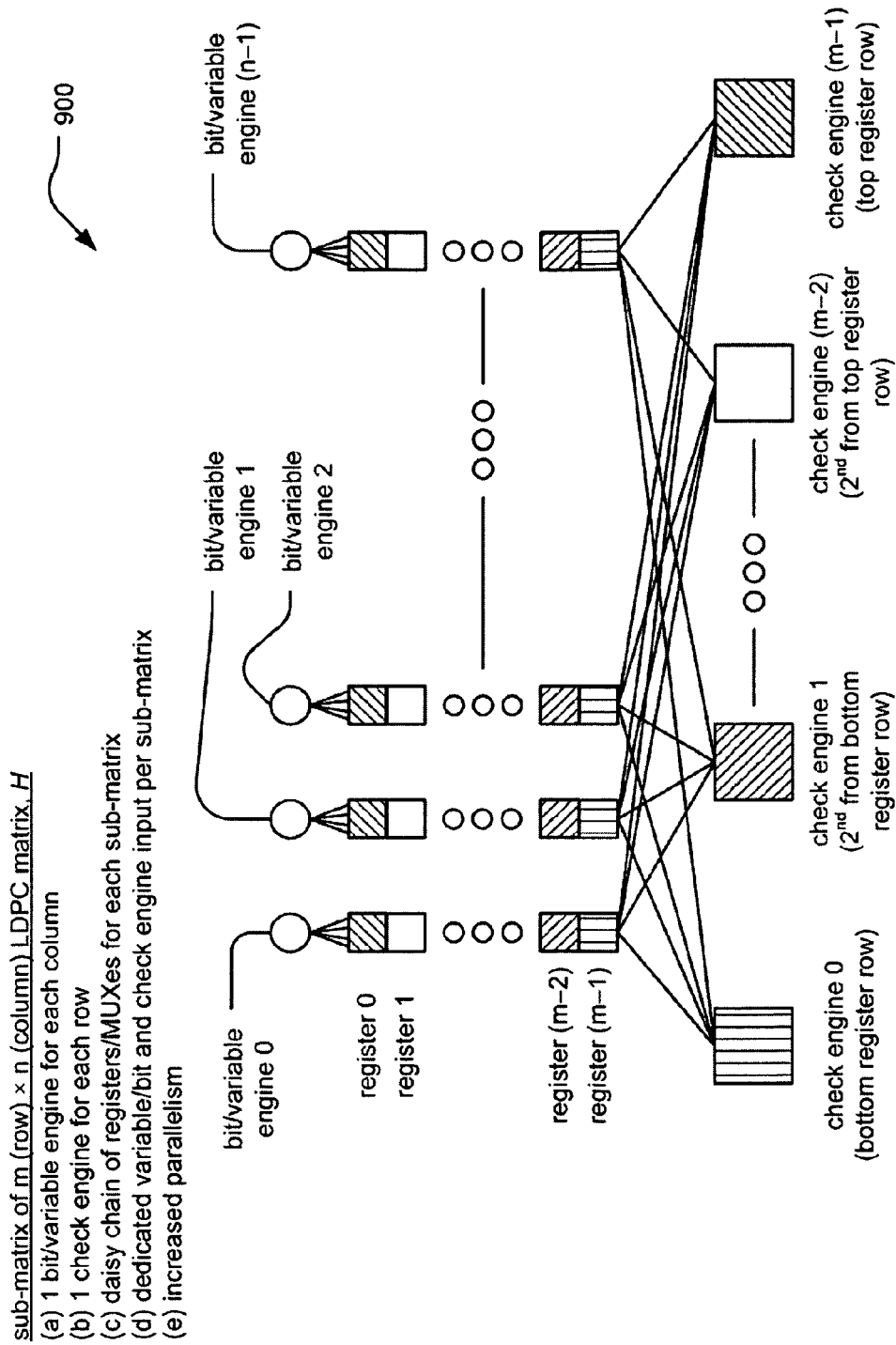
FIG. 9 illustrates an embodiment of distributed sub-matrix based belief propagation decoding processing or message passing decoding processing.

FIG. 9 illustrates an embodiment of distributed sub-matrix based belief propagation decoding processing or message passing decoding processing 900. This embodiment employs a number of registers for storing bit edge messages and check edge messages. In one embodiment, the decoding processing is performed on a sub-matrix basis. There is implemented 1 bit/variable engine for each column of the sub-matrix and 1 check engine for each row of the sub-matrix of the low density parity check matrix, H. The architecture includes a daisy chain composed of registers and MUXs (only localized MUXs such as those with merely 2 inputs). There is also dedicated variable/bit and check engine input per sub-matrix. All of these components provide for increased parallelism.

This particular embodiment operates on a sub-matrix having size of m (row)×n (column). As can be seen, there are m implemented check engines, and n implemented variable/bit engines. The bottom row of registers employs the first check engine (e.g., check engine 0), the $2^{nd}$ from bottom register row employs the check engine 1. The $2^{nd}$ from top register row employs the check engine (m−1), and the top register row employs the check engine (m).

Figure 10:
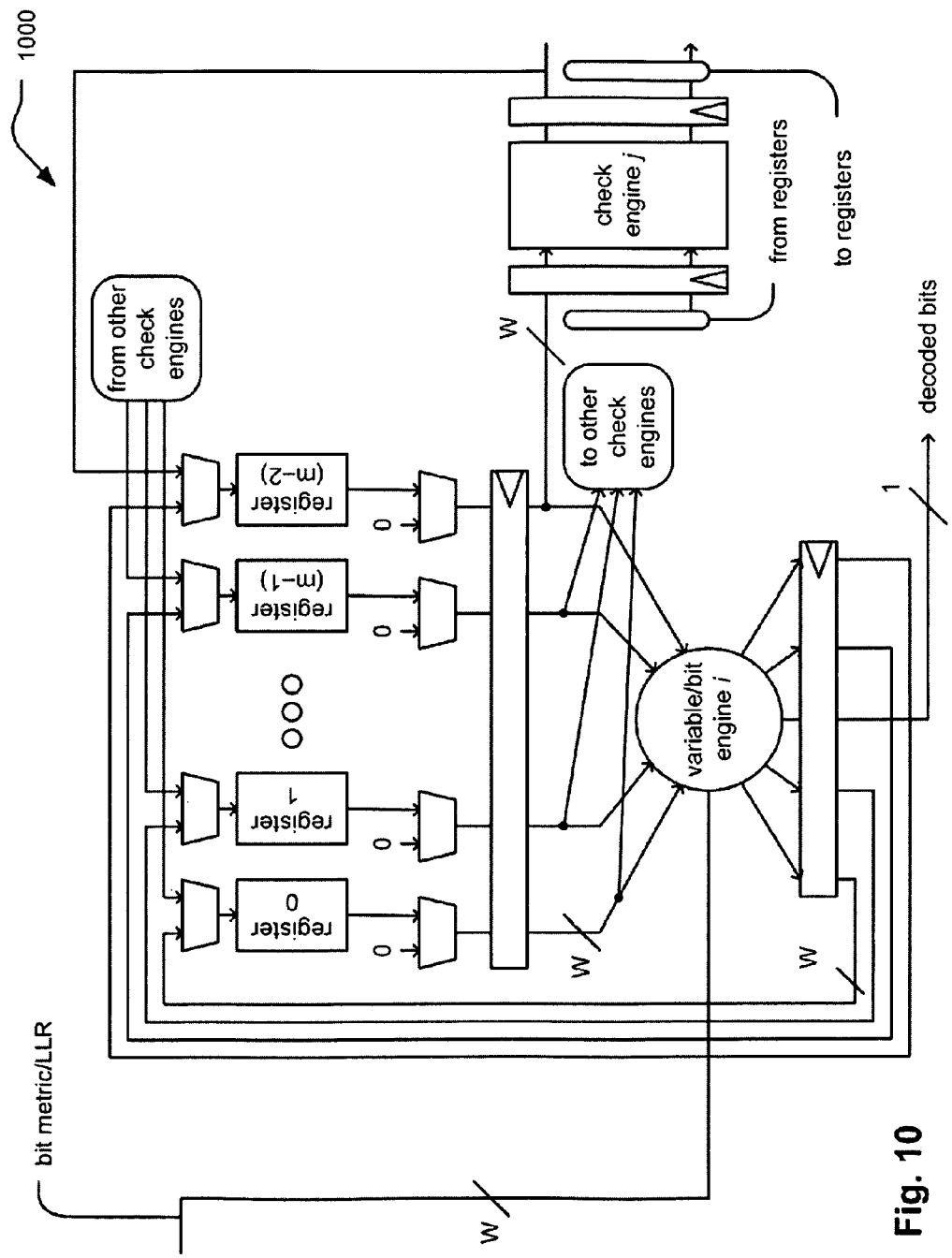
FIG. 10 illustrates an alternative embodiment of distributed sub-matrix based belief propagation decoding processing or message passing decoding processing.

FIG. 10 illustrates an alternative embodiment of distributed sub-matrix based belief propagation decoding processing or message passing decoding processing 1000. The embodiment depicts the relationship and connectivity between a variable/bit engine i and a check engine j. Within each super-iteration (e.g., which involves one sub-iteration of check node processing and of one sub-iteration of bit node processing), all of the check edge messages and bit edge messages are updated. As can be seen, there is no requirement for any barrel shifter herein. The only "memory" requirement in such an embodiment is that of a plurality of registers and appropriately placed MUXs.

Figure 11:
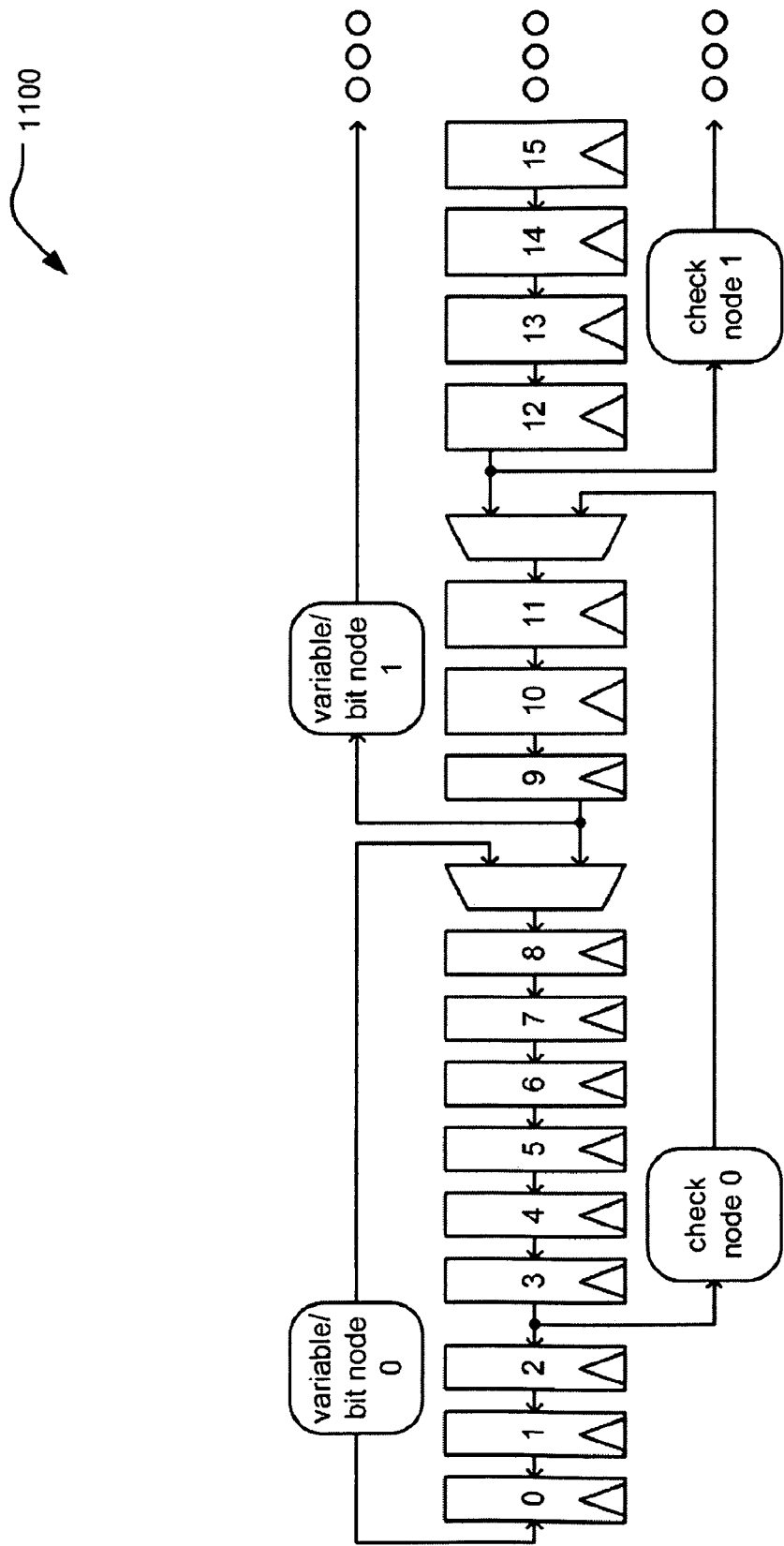
FIG. 11 illustrates an embodiment of a daisy chain architecture that is operable to perform decoding of an LDPC coded signal.

FIG. 11 illustrates an embodiment of a daisy chain architecture 1100 that is operable to perform decoding of an LDPC coded signal. This alternative embodiment of a daisy chain architecture shows the connectivity that can be employed between a plurality of check engines (e.g., depicted by the check node 0, check node 1, etc.) and a plurality of bit engines (e.g., depicted by the variable/bit node 0, variable/bit node 1, etc.). As described above elsewhere herein, any number of various means can be employed for check node processing such as sum-product, min-sum (reference [5] by Anastasopoulos, 2001), modified min-sum (reference [6] by Karkooti, et al., 2004), and BCJR (reference [7] by Mansour, et al. 2002).

This particular embodiment corresponds to a Cyclic Shifted Identity (CSI) sub-matrix with a shift of 3. In this embodiment, there are 9 cycles for the variable/bit update (e.g., bit node processing sub-iteration) and 9 cycles for the check update (e.g., check node processing sub-iteration).

Figure 12:
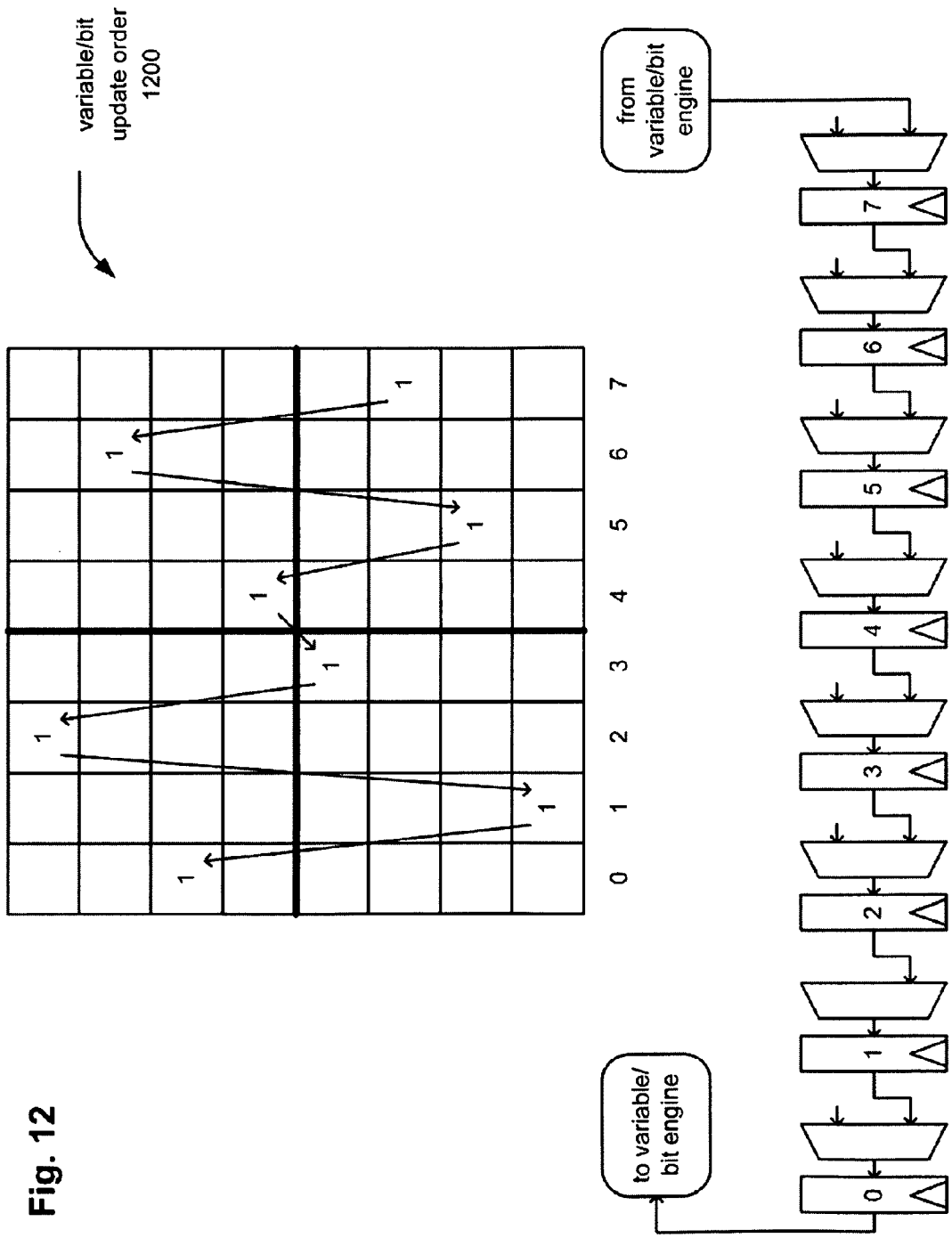
FIG. 12 illustrates an embodiment of variable/bit update order employed for a low density parity check matrix, H, having non-CSI (Cyclic Shifted Identity) sub-matrices.

FIG. 12 illustrates an embodiment of variable/bit update order 1200 employed for a low density parity check matrix, H, having non-CSI (Cyclic Shifted Identity) sub-matrices. In this embodiment, for each sub-block or sub-matrix, the flip-flops (FFs) or registers are doubly linked/connected as two separate daisy chains to realize the sub-matrix pattern for use in both check node processing and bit node processing. FIG. 12 depicts the connectivity between the registers and the MUXs for variable/bit node processing, and FIG. 13 depicts the connectivity between the registers and the MUXs for check node processing.

Figure 13:
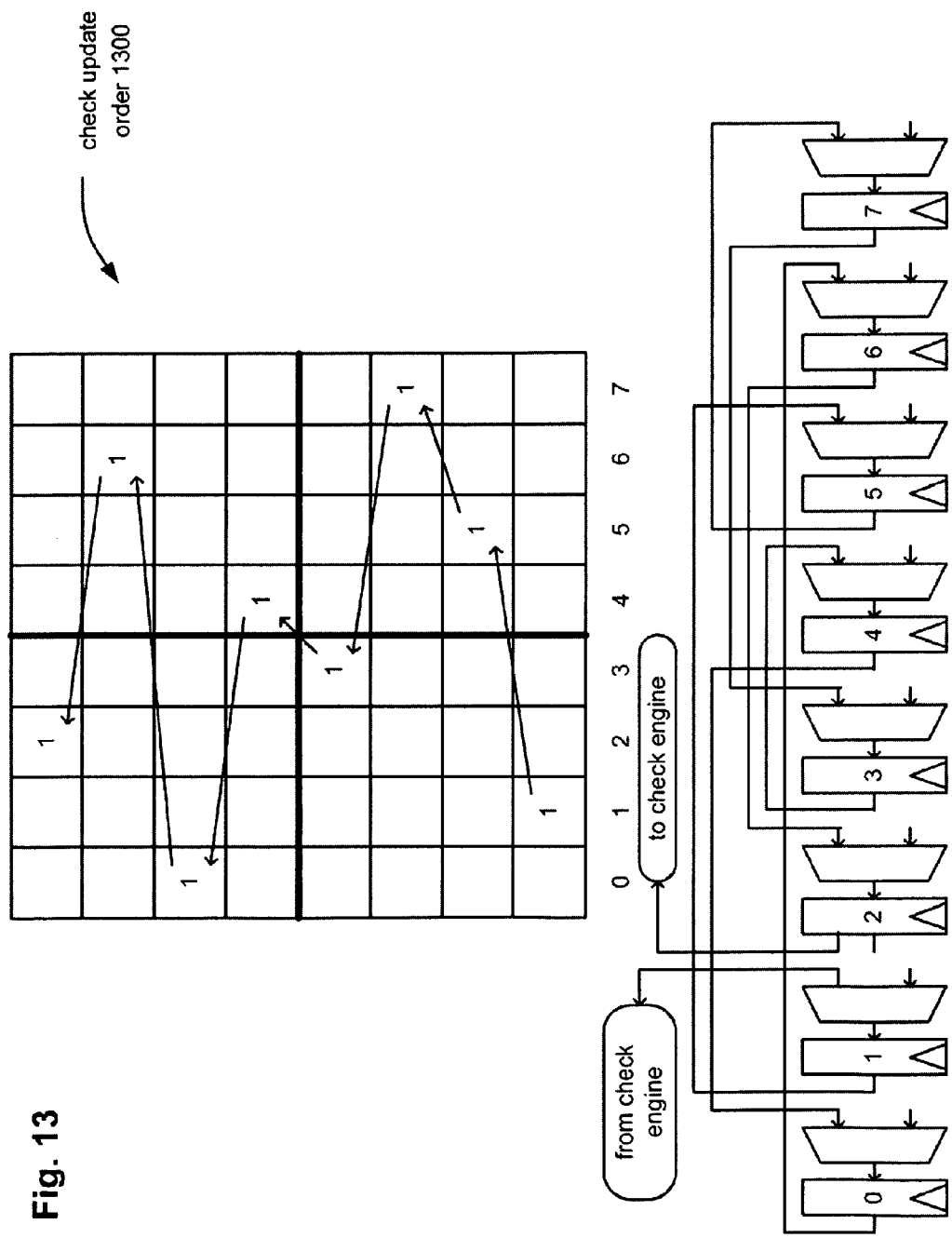
FIG. 13 illustrates an embodiment of check update order employed for the low density parity check matrix, H, having non-CSI sub-matrices depicted also of FIG. 12.

FIG. 13 illustrates an embodiment of check update order 1300 employed for the low density parity check matrix, H, having non-CSI sub-matrices depicted also of FIG. 12. As can be seen, the alternative connectivity between the registers and the MUXs is slightly different for check node processing as compared to the variable/bit node processing of FIG. 12. Since this embodiment is for a low density parity check matrix, H, having at least one non-CSI sub-matrix, there is a double-linking/connection between the daisy chain such that one means of connection is employed for bit node processing and the other is employed for check node processing.

Figure 14:
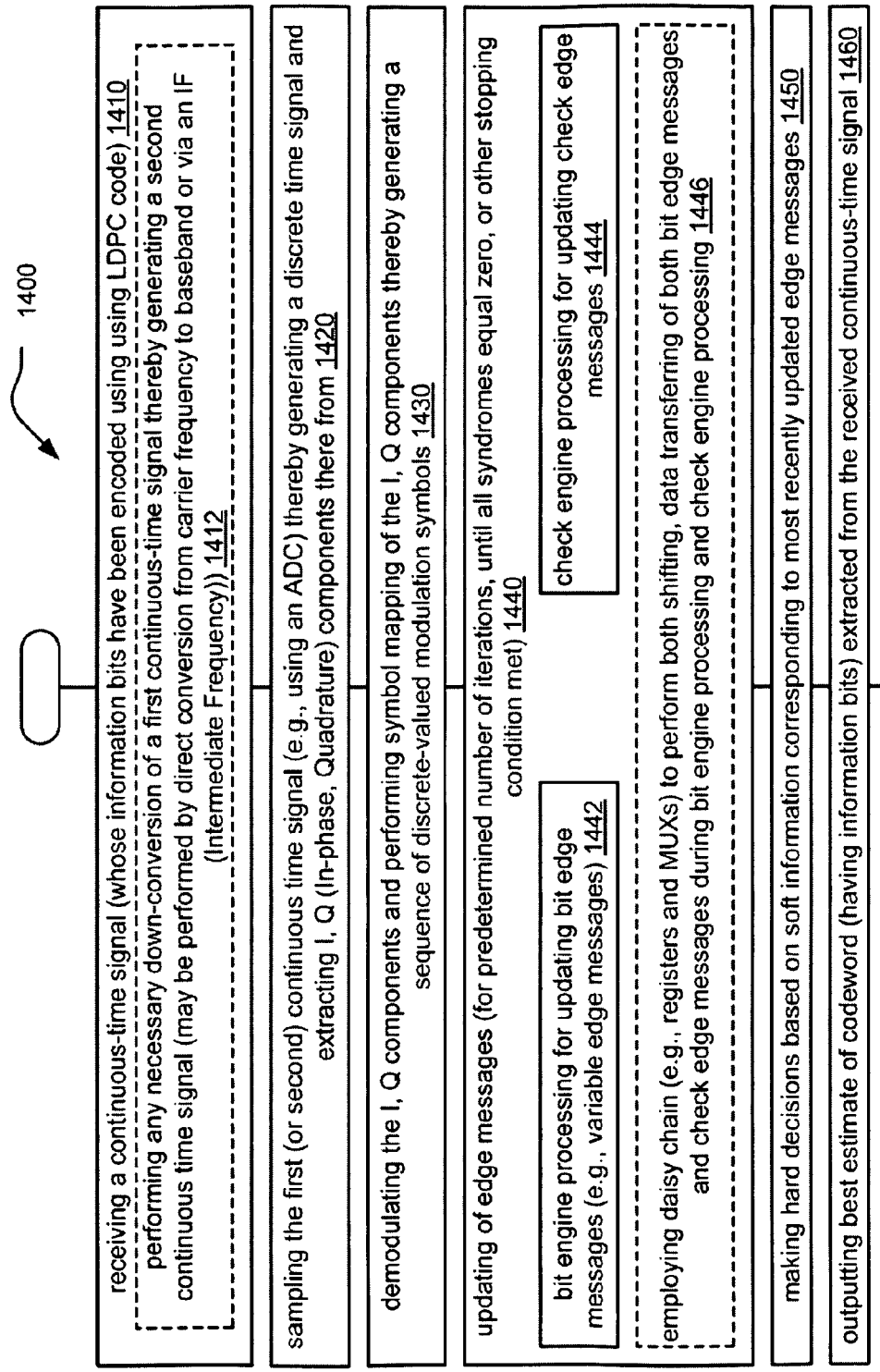
FIG. 14 illustrates an embodiment of a method for processing an LDPC coded signal.

FIG. 14 illustrates an embodiment of a method 1400 for processing an LDPC coded signal. The method 1400 initially involves receiving a continuous-time signal, as shown in a block 1410. This receiving and processing of the continuous-time signal may also involve performing any necessary down-conversion of a first continuous-time signal thereby generating a second continuous-time signal, as shown in a block 1412. Any frequency conversion that may need to be performed may possibly be performed by direct conversion from carrier frequency to a baseband frequency. This frequency conversion may alternatively be performed via an IF (Intermediate Frequency). In whichever embodiment, the received continuous-time signal is typically brought down in frequency to a baseband continuous-time signal when performing this method. Also, certain types of gain adjustment/gain control may be applied to the received continuous-time signal.

The method 1400 also involves sampling the first (or second) continuous-time signal thereby generating a discrete-time signal and extracting I, Q (In-phase, Quadrature) components there from, as shown in a block 1420. This sampling may be performed using an ADC (Analog to Digital Converter) or equivalent means to generate the discrete-time signal from the appropriately down-converted (and potentially also filtered, gain adjusted, etc.) received continuous-time signal. The I, Q components of the individual samples of the discrete time signal are also extracted within this step. The method 1400 then involves demodulating the I, Q components and can involve performing symbol mapping of the I, Q components (e.g., to a constellation shape having a mapping of the constellation points therein) thereby generating a sequence of discrete-valued modulation symbols, as shown in a block 1430.

The next step of the method 1400 involves performing updating of edge messages until a stopping condition is met (e.g., for a predetermined number of iterations, until all syndromes are equal to zero, or until some other stopping criterion is met), as shown in a block 1440. This step may be viewed as performing the LDPC decoding in accordance with any of the various embodiments described above. This LDPC decoding generally involves bit engine processing for updating bit edge messages (e.g., variable edge messages) (as shown in a block 1442) as well as check engine processing for updating check edge messages (as shown in a block 1444). In addition, the LDPC decoding of the method 1400 can also involve employing a daisy chain (e.g., registers and MUXs) to perform both shifting, data transferring of both bit edge messages and check edge messages during bit engine processing and check engine processing.

After the stopping condition has been met, the method 1400 involves making hard decisions based on soft information corresponding to most recently updated bit edge messages, as shown in a block 1450. The method 1400 ultimately involves outputting a best estimate of the LDPC coded bits (LDPC codeword, or LDPC code block) (that includes the information bits) that has been extracted from the received continuous-time signal, as shown in a block 1460.

In this disclosure, it is noted that once a low density parity check matrix, H, is available for use in decoding processing at a receiving end of a communication channel, the corresponding generator matrix, G, of the LDPC code may be generated straightforwardly from the low density parity check matrix, H. Having this information allows a designer to implement the encoding processing (using the generator matrix, G, of the LDPC code) at the transmitter end of the communication channel and also for decoding processing (using the low density parity check matrix, H, of the LDPC code) at the receiver end of the communication channel. In fact, it is common in the art that an LDPC code is defined directly from the low density parity check matrix, H. Stated another way, the low density parity check matrix, H, includes all of the necessary information to define the LDPC code.

Figure 15:
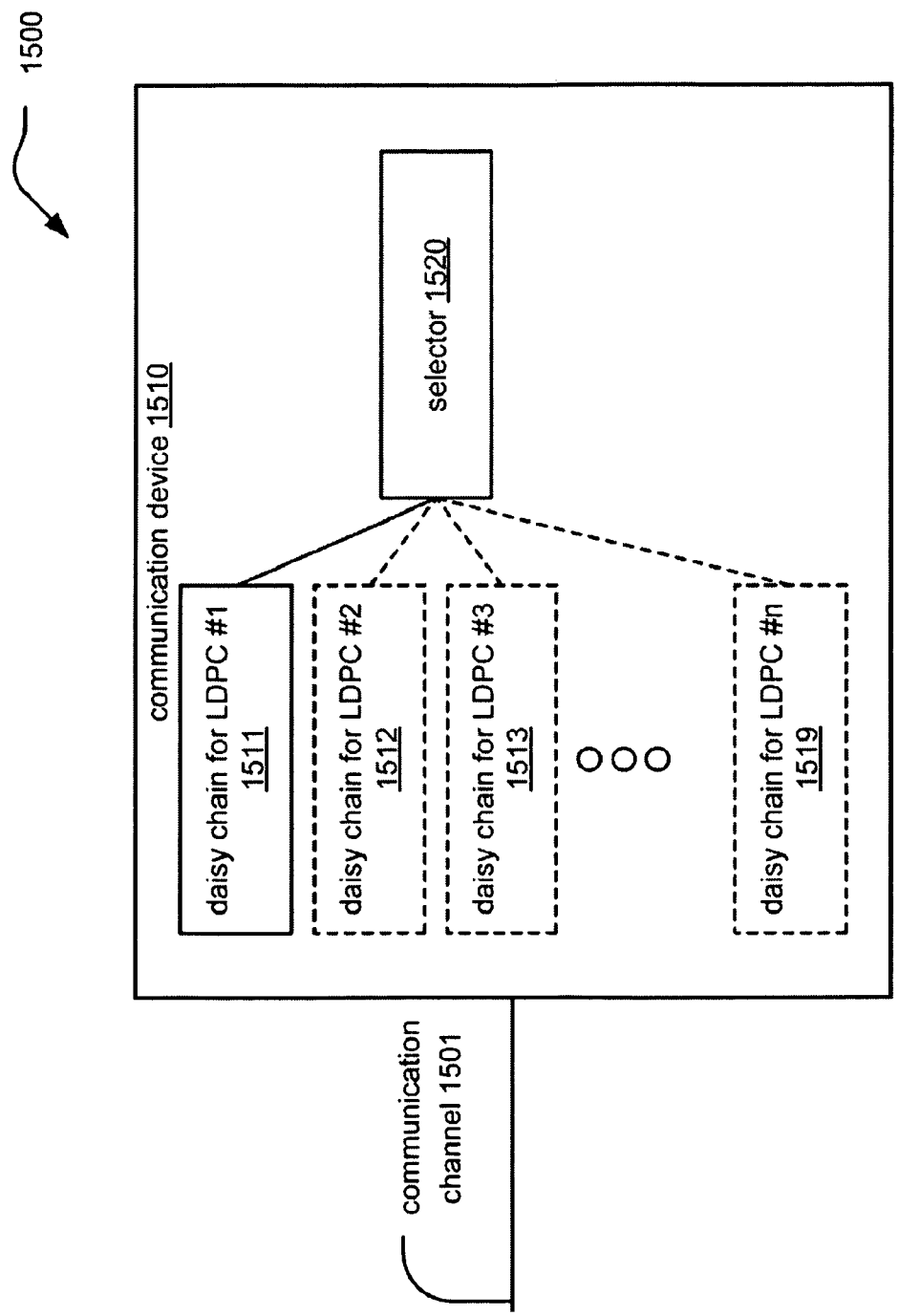
FIG. 15 illustrates an embodiment that includes a communication device having multi-LDPC code capability.

FIG. 15 illustrates an embodiment 1500 that includes a communication device 1510 having multi-LDPC code capability. Sometimes, it is desirable to have a communication device 1510, coupled to a communication channel 1501, that can decode different LDPC coded signals such that each LDPC coded signal is generated in accordance with a different low density parity check matrix, H. For example, sometimes a communication device needs to receive and decode a first signal that has a corresponding first low density parity check matrix, H1, a second signal that has a corresponding second low density parity check matrix, H2, and so on.

In accordance with this, the communication device 1510 includes a number of different daisy chains that correspond to the different LDPC codes. A selector module 1520 is operable to select the appropriate daisy chain to be employed when decoding a particular LDPC coded signal. For example, the selector module 1520 is operable to select a first daisy chain for decoding a first signal that has a corresponding first low density parity check matrix, H1, as shown by reference numeral 1511. The selector module 1520 is operable to select a second daisy chain for decoding a second signal that has a corresponding second low density parity check matrix, H2, as shown by reference numeral 1512, the selector module 1520 is operable to select a third daisy chain for decoding a third signal that has a corresponding third low density parity check matrix, H3, as shown by reference numeral 1513, and so on. Generally speaking, the selector module 1520 is operable to select an $n^{th}$ daisy chain for decoding an $n^{th}$ signal that has a corresponding $n^{th}$ low density parity check matrix, Hn, as shown by reference numeral 1511.

Figure 16:
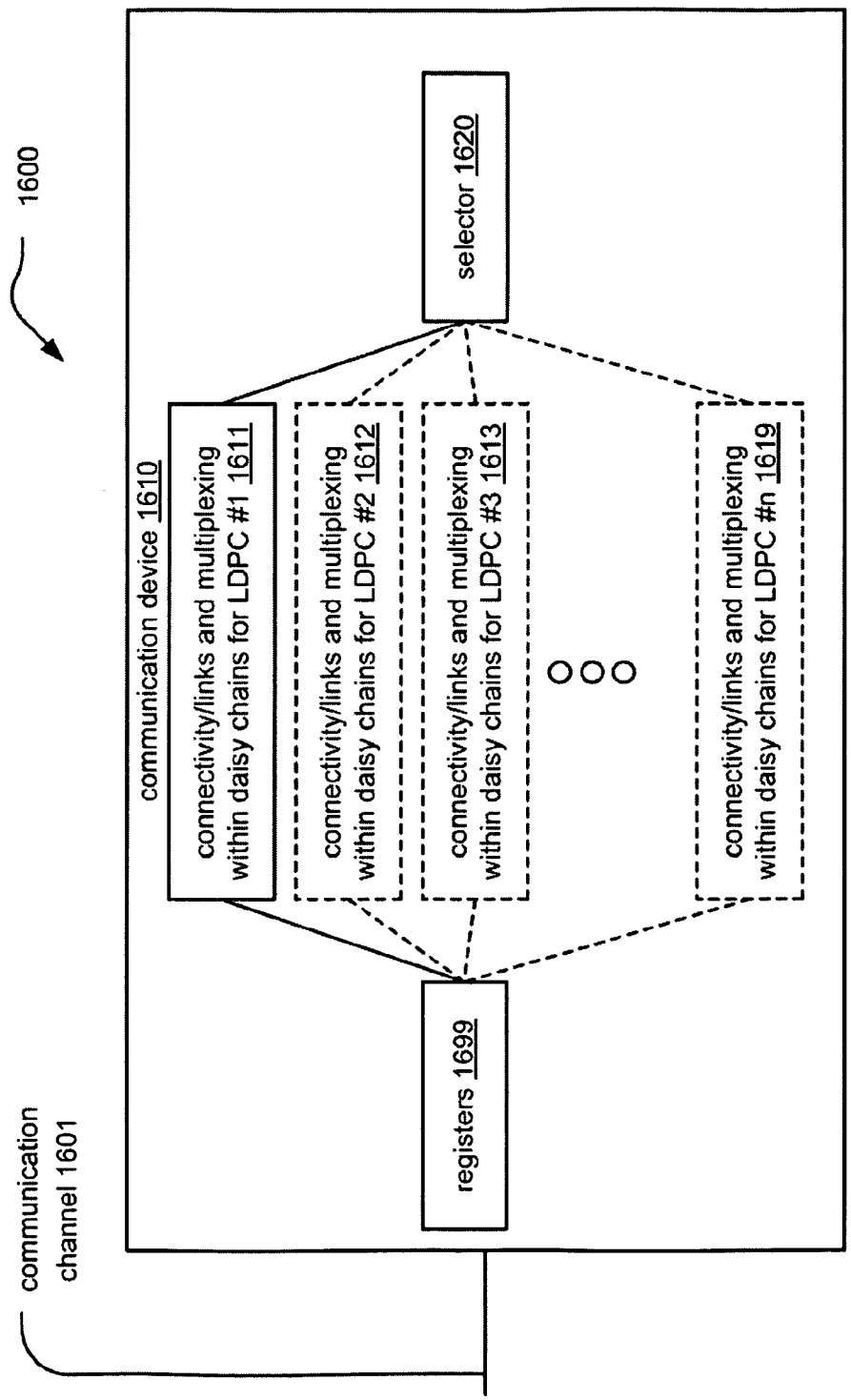
FIG. 16 illustrates an alternative embodiment that includes a communication device having multi-LDPC code capability.

FIG. 16 illustrates an alternative embodiment 1600 that includes a communication device 1610 having multi-LDPC code capability. As also mentioned above, sometimes it is desirable to have a communication device 1610, coupled to a communication channel 1601, that can decode different LDPC coded signals such that each LDPC coded signal is generated in accordance with a different low density parity check matrix, H. For example, sometimes a communication device needs to receive and decode a first signal that has a corresponding first low density parity check matrix, H1, a second signal that has a corresponding second low density parity check matrix, H2, and so on.

In accordance with this, the communication device 1610 includes a single group of registers 1699, and the connectivity/links between the registers of the daisy chains (as well as the appropriate multiplexing) is changed depending on which low density parity check matrix, H, is to be employed to decode a particular LDPC coded signal. The embodiment of FIG. 15 includes multiple, dedicated daisy chains, yet the embodiment of FIG. 16 is operable to employ the very same sets of registers but modifies the connectivity via the necessary links to the daisy chains based on which particular low density parity check matrix, H, is being employed at a given time.

While this embodiment of FIG. 16 may increase the number and size of MUXs needed (e.g., there may be some need for more than only 2-input type MUXs), this still has a much lower hardware requirement than implementing separate and distinct register daisy chains for each different LDPC code (e.g., as shown with respect to FIG. 15). It is noted also that this embodiment of FIG. 16 can not only be employed to support multiple codes, but also can accommodate LDPC coded with different sub-matrix sizes using the very same sets of registers 1699. This can be implemented simply by modifying the connectivity/links between the registers of the daisy chains as well as any appropriate multiplexing.

A selector module 1620 is operable to select the appropriate connectivity/links and multiplexing within the daisy chains when decoding a particular LDPC coded signal. For example, the selector module 1620 is operable to select a first connectivity/links and multiplexing for decoding a first signal that has a corresponding first low density parity check matrix, H1, as shown by reference numeral 1611. The connectivity/links and multiplexing within the daisy chains are appropriately set based on this selection corresponding to reference numeral 1611.

The selector module 1620 is operable to select a second connectivity/links and multiplexing for decoding a second signal that has a corresponding second low density parity check matrix, H2, as shown by reference numeral 1612. The connectivity/links and multiplexing within the daisy chains are appropriately set based on this selection corresponding to reference numeral 1612.

Similarly, the selector module 1620 is operable to select a third connectivity/links and multiplexing for decoding a third signal that has a corresponding third low density parity check matrix, H2, as shown by reference numeral 1613. The connectivity/links and multiplexing within the daisy chains are appropriately set based on this selection corresponding to reference numeral 1613.

Generally speaking, the selector module 1620 is operable to select an $n^{th}$ connectivity/links and multiplexing for decoding an $n^{th}$ signal that has a corresponding $n^{th}$ low density parity check matrix, H2, as shown by reference numeral 1619. The connectivity/links and multiplexing within the daisy chains are appropriately set based on this selection corresponding to reference numeral 1619.

The throughput of an LDPC decoder implemented in accordance with the daisy chain as described herein, in terms of number of cycles per iteration, can be defined as follows:

$$N_{cycles/iter} = \left\lceil \frac{Z}{par_{chk}} \right\rceil + pipe_{chk} + \left\lceil \frac{Z}{par_{var/bit}} \right\rceil + pipe_{var/bit}, \text{ where}$$

$\lceil x \rceil$: the ceiling function of x, or the result generated when rounding up the floating point value of x to the next integer value when x is not an integer value (e.g., $$\left\lceil \frac{Z}{par_{chk}} \right\rceil$$

is the result generated when rounding up the floating point value of $$\frac{Z}{par_{chk}}$$

to the next integer value when $$\frac{Z}{par_{chk}}$$

is not an integer value; and $$\left\lceil \frac{Z}{par_{var/bit}} \right\rceil$$

is the result generated when rounding up the floating point value of $$\frac{Z}{par_{var/bit}}$$

to the next integer value when $$\frac{Z}{par_{var/bit}}$$

is not an integer value);

Z: the sub-matrix or sub-block size;

$pipe_{var/bit}$: the number of pipeline stages of the bit node processing configuration of the daisy chain;

$par_{var/bit}$: the parallel factor of the bit node processing configuration of the daisy chain;

$pipe_{chk}$: the number of pipeline stages of the check node processing configuration of the daisy chain; and $par_{chk}$: the parallel factor of the check node processing configuration of the daisy chain.

It is also noted that some initialization time is required at start-up to prime the check nodes (e.g., using the received signal values to provide initialed values of the bit edge messages for the first check node processing sub-iteration step). The initialization/start-up time is equal to $$\left[\left\lceil\frac{Z}{par_{\text{var/bit}}}\right\rceil + pipe_{\text{var/bit}}\right]_{\text{initialization}}$$

cycles (as also depicted in the equation below. The memories can be seeded with the bit/variable node outputs during this initialization/start-up.

The number of cycles to perform decoding processing of each block can be given as follows:

$$N_{\text{cycles/block}} = \left[\left\lceil\frac{Z}{par_{\text{var/bit}}}\right\rceil + pipe_{\text{var/bit}}\right]_{\text{initialization}} + \\ N_{\text{iter}} \times \left[\left\lceil\frac{Z}{par_{\text{chk}}}\right\rceil + pipe_{\text{chk}} + \left\lceil\frac{Z}{par_{\text{var/bit}}}\right\rceil + pipe_{\text{var/bit}}\right]$$

Generally speaking, the daisy chain configuration presented herein provides a means by which a designer can trade-off area of an integrated circuitry as a function of the throughput desired and/or needed with a higher degree of granularity.

There are many inherent properties provided by the novel means of decoding LDPC coded signals. For example, when comparing this novel means presented herein that employs a daisy chain type configuration to a fully parallel LDPC decoder that can be implemented to include a message wire for every connection between check nodes and bit nodes as described in reference [10] cited above by Blanksby, et al. 2002, it can be seen that such a fully parallel LDPC decoder will result in an optimum throughput but will undesirably suffer from routing congestion and result in a large area. The novel decoding means presented herein using a daisy chain configuration does not suffer such deleterious effects.

Moreover, when comparing this novel means presented herein that employs a daisy chain type configuration to a fully parallel LDPC decoder, it is noted that fully parallel designs have proven unfeasible for large code lengths (larger than 1000 bits) because the area and routing complexity are prohibitive (e.g., see reference [6] cited above by Karkooti, et al., 2004).

A serial LDPC decoder consists of a single check node and a single bit node. During decoding, the single check node sequentially processes every row in the parity check matrix. Upon conclusion of the check node update, the bit node sequentially processes every column in the parity check matrix. Such a design's throughput is too low for most practical applications.

There are several published designs for semi-parallel LDPC decoders (e.g., see reference [6] cited above by Karkooti, et al., 2004 and reference [11] of Zhong, et al., 2005 cited below).

[11] Zhong, H., and Zhang, T., "Block-LDPC: A Practical LDPC Coding System Design Approach", *IEEE Transactions on Circuits and Systems*, Vol. 52, No. 4, April 2005, pp. 766-775.

These semi-parallel LDPC decoding designs use a RAM to represent the check edge messages corresponding to any given sub-block. The RAM can store either check edge messages or bit edge messages, depending on the stage of the sub-iteration (e.g., whether performing check node processing or bit node processing). The degree of parallelism in these semi-parallel LDPC decoders is fixed at one processor per sub-block, which results in insufficient throughput for many real-world applications. Another disadvantage of this design is that ROMs (or some other memory types devices) are required to store the sub-block shifts in the low density parity check matrix, H.

These deficiencies are obviated by the daisy chain implementation presented herein, in that, although there is a memory requirement that is the same as the SRAM approach, there is nevertheless no requirement for any large fan-in MUX or barrel shifter, and the daisy chain itself is the element which performs the shifting of the edge messages.

Moreover, another of the many benefits and advantages provided inherently by the novel daisy chain architecture presented herein for decoding LDPC coded signals is that it can be tuned precisely to meet the performance requirements of the target application. Specifically, the architecture allows any number of bit nodes and check nodes to perform the processing in parallel. This is in contrast to published semi-parallel LDPC decoders (e.g., see reference [6] cited above by Karkooti, et al., 2004 and reference [11] cited above of Zhong, et al., 2005) which limit the bit nodes and check nodes to one each per sub-block.

A fully parallel LDPC decoder (e.g., see reference [10] cited above by Blanksby, et al. 2002) is too congested and high area for a large codeword (e.g., see reference [6] cited above by Karkooti, et al., 2004).

However, with the distributed processing architecture presented herein using the daisy chain architecture, the parallelism can be decreased until the area and congestion become manageable and/or is appropriate (or acceptable) for a given application.

The novel daisy chain architecture presented herein also does not contain any barrel shifters or high fan-in multiplexers (as mentioned above). Thus, the critical path is relatively short and it can also be pipelined to further increase data throughput.

In addition, unused processing nodes (e.g., unused bit engines and/or check engines) and daisy chain registers can be put into a sleep mode to save power within a communication device. This technique can be used for applications that operate to perform decoding of various types of LDPC coded signals (e.g., use multiple low density parity check matrices, $H_1$, $H_2$, etc., when decoding LDPC coded signal 1, LDPC coded signal 2, etc.) and/or varying sub-block sizes (e.g., such as referred to in FIG. 15 above).

It is also noted that the novel daisy chain architecture/message structure employed within such a distributed processing LDPC decoder constructed in accordance with the various aspects presented herein can be adapted for use in systems where the sub-block size varies with the same basic parity check matrix. One example of such a system is found in the IEEE 802.16e standard.

When a large sub-block size is necessary, the daisy chain is extended to hold the extra edge messages. Additional check and bit nodes (e.g., additional check engines and bit engines) are connected to the extended portion of the daisy chain to process the extra edge messages. When a smaller sub-block size is chosen, the extended portion of the daisy chain as well as the bit and check nodes connected thereto could be put into a sleep mode to save power within the communication device.

The novel daisy chain architecture presented herein of a distributed processing LDPC decoder is highly scalable in parallelism, which makes it suitable for a broad range of applications requiring different levels of throughput and chip area. Any number of bit nodes and check nodes from 1 to the sub-block size can be used in parallel. It is also noted that the number of bit nodes (e.g., bit engines) does not need to be the same as the number of check nodes (e.g., check engines).

Such a distributed processing LDPC decoder, constructed using the daisy chain principles presented herein, can be considered for any application requiring LDPC decoding, including IEEE 802.3an, IEEE 802.11n, IEEE 802.20, and/or DVB-S2 among other application contexts. Using this novel architecture, a designer is able to provide the minimum amount of parallelism in order to meet the throughput requirements typical in many modern applications while also providing savings with respect to power and area of a communication device and/or communication system.

It is noted that the various modules (e.g., encoding modules, decoding modules, bit engines, check engines, etc.) described herein may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The operational instructions may be stored in a memory. The memory may be a single memory device or a plurality of memory devices. Such a memory device may be a read-only memory, random access memory, volatile memory, non-volatile memory, static memory, dynamic memory, flash memory, and/or any device that stores digital information. It is also noted that when the processing module implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry. In such an embodiment, a memory stores, and a processing module coupled thereto executes, operational instructions corresponding to at least some of the steps and/or functions illustrated and/or described herein.

The present invention has also been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention.

The present invention has been described above with the aid of functional building blocks illustrating the performance of certain significant functions. The boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention.

One of average skill in the art will also recognize that the functional building blocks, and other illustrative blocks, modules and components herein, can be implemented as illustrated or by discrete components, application specific integrated circuits, processors executing appropriate software and the like or any combination thereof.

Moreover, although described in detail for purposes of clarity and understanding by way of the aforementioned embodiments, the present invention is not limited to such embodiments. It will be obvious to one of average skill in the art that various changes and modifications may be practiced within the spirit and scope of the invention, as limited only by the scope of the appended claims.

What is claimed is:

1. A decoder that is operable to decode an LDPC (Low Density Parity Check) coded signal, the decoder comprising:
a plurality of registers and a plurality of multiplexers (MUXs) configured in a daisy chain, wherein the plurality of registers is operable to store both bit edge messages and check edge messages and the plurality of MUXs is interposed amongst the plurality of registers; and
a check engine that is operable to employ a first bit edge message to update a first check edge message thereby generating a second check edge message; and
a bit engine that is operable to:
employ the second check edge message to update a second bit edge message thereby generating a third bit edge message; and
employ the third bit edge message to generate soft information corresponding to an information bit encoded into the LDPC coded signal; and wherein:
the soft information corresponding to the information bit encoded into the LDPC coded signal is used to make a best estimate of the information bit encoded into the LDPC coded signal;
each register of the plurality of registers corresponds to a non-null location within a sub-matrix of a parity check matrix of an LDPC code by which the LDPC coded signal is generated;
each register of the plurality of registers is operable to shift a check edge message or a bit edge message contained therein by one location;
during bit node processing, a first select signal is provided to the plurality of MUXs that is interposed amongst the plurality of registers to ensure a check edge message is provided from at least one register of the plurality of registers to the bit engine; and
during check node processing, a second select signal is provided to the plurality of MUXs that is interposed amongst the plurality of registers to ensure a bit edge message is provided from at least one register of the plurality of registers to the check engine.

2. The decoder of claim 1, further comprising:
a plurality of check engines that includes the check engine;
a plurality of bit engines that includes the bit engine; and wherein:
the plurality of registers is hard-wired to the plurality of bit engines and the plurality of check engines based on non-null location within the parity check matrix of the LDPC code by which the LDPC coded signal is generated.

3. The decoder of claim 1, wherein:
the parity check matrix of the LDPC code by which the LDPC coded signal is generated includes a plurality of CSI (Cyclic Shifted Identity) sub-matrices.

4. The decoder of claim 1, wherein:
the parity check matrix of the LDPC code by which the LDPC coded signal is generated includes a plurality of non-CSI (Cyclic Shifted Identity) sub-matrices.

5. The decoder of claim 1, wherein:
the parity check matrix of the LDPC code by which the LDPC coded signal is generated includes at least one CSI (Cyclic Shifted Identity) sub-matrix and at least one non-CSI sub-matrix.

6. The decoder of claim 1, wherein:
the parity check matrix of the LDPC code by which the LDPC coded signal is generated includes a plurality of square sub-matrices.

7. The decoder of claim 1, wherein:
the decoder is operable to perform belief propagation decoding processing or message passing decoding processing.

8. The decoder of claim 1, wherein:
the daisy chain configuration is operable to perform shifting of a plurality of bit edge messages for bit node processing or shifting of a plurality of check edge messages for check node processing.

9. The decoder of claim 1, wherein:
the decoder is implemented within an integrated circuitry.

10. The decoder of claim 1, wherein:
the decoder is implemented within a communication device that is operable to receive the LDPC coded signal from a communication channel; and
the communication device is implemented within at least one of a satellite communication system, a wireless communication system, a wired communication system, and a fiber-optic communication system.

11. A decoder that is operable to decode an LDPC (Low Density Parity Check) coded signal, the decoder comprising:
a plurality of registers and a plurality of multiplexers (MUXs) configured in a daisy chain, wherein the plurality of registers is operable to store both bit edge messages and check edge messages and the plurality of MUXs is interposed amongst the plurality of registers; and
a plurality of check engines that is operable to employ a first plurality of bit edge messages to update a first plurality of check edge messages thereby generating a second plurality of check edge messages; and
a plurality of bit engines that is operable to:
  employ the second plurality of check edge messages to update a second plurality of bit edge messages thereby generating a third plurality of bit edge messages; and
  employ the third plurality of bit edge messages to generate soft information corresponding to at least one information bit encoded into the LDPC coded signal; and wherein:
the soft information corresponding to the at least one information bit encoded into the LDPC coded signal is used to make a best estimate of the at least one information bit encoded into the LDPC coded signal;
each register of the plurality of registers corresponds to a non-null location within a sub-matrix of a parity check matrix of an LDPC code by which the LDPC coded signal is generated;
each register of the plurality of registers is operable to shift a check edge message or a bit edge message contained therein by one location;
during bit node processing, a first select signal is provided to the plurality of MUXs that is interposed amongst the plurality of registers to ensure a check edge message is provided from at least one register of the plurality of registers to the bit engine;
during check node processing, a second select signal is provided to the plurality of MUXs that is interposed amongst the plurality of registers to ensure a bit edge message is provided from at least one register of the plurality of registers to the check engine;
the plurality of registers is hard-wired to the plurality of bit engines and the plurality of check engines based on non-null location within the parity check matrix of the LDPC code by which the LDPC coded signal is generated; and
the decoder is operable to perform belief propagation decoding processing or message passing decoding processing.

12. The decoder of claim 11, wherein:
the parity check matrix of the LDPC code by which the LDPC coded signal is generated includes a plurality of CSI (Cyclic Shifted Identity) sub-matrices.

13. The decoder of claim 11, wherein:
the parity check matrix of the LDPC code by which the LDPC coded signal is generated includes a plurality of non-CSI (Cyclic Shifted Identity) sub-matrices.

14. The decoder of claim 11, wherein:
the parity check matrix of the LDPC code by which the LDPC coded signal is generated includes at least one CSI (Cyclic Shifted Identity) sub-matrix and at least one non-CSI sub-matrix.

15. The decoder of claim 1, wherein:
the parity check matrix of the LDPC code by which the LDPC coded signal is generated includes a plurality of square sub-matrices.

16. The decoder of claim 11, wherein:
the decoder is implemented within an integrated circuitry.

17. The decoder of claim 11, wherein:
the decoder is implemented within a communication device that is operable to receive the LDPC coded signal from a communication channel; and
the communication device is implemented within at least one of a satellite communication system, a wireless communication system, a wired communication system, and a fiber-optic communication system.

18. A decoder, implemented in an integrated circuitry, that is operable to decode an LDPC (Low Density Parity Check) coded signal, the integrated circuitry comprising:
a plurality of registers and a plurality of multiplexers (MUXs) configured in a daisy chain, wherein the plurality of registers is operable to store both bit edge messages and check edge messages and the plurality of MUXs is interposed amongst the plurality of registers; and
a check engine that is operable to employ a first bit edge message to update a first check edge message thereby generating a second check edge message; and
a bit engine that is operable to:
  employ the second check edge message to update a second bit edge message thereby generating a third bit edge message; and
  employ the third bit edge message to generate soft information corresponding to an information bit encoded into the LDPC coded signal; and wherein:
the soft information corresponding to the information bit encoded into the LDPC coded signal is used to make a best estimate of the information bit encoded into the LDPC coded signal;
each register of the plurality of registers corresponds to a non-null location within a sub-matrix of a parity check matrix of an LDPC code by which the LDPC coded signal is generated;

each register of the plurality of registers is operable to shift a check edge message or a bit edge message contained therein by one location;

during bit node processing, a first select signal is provided to the plurality of MUXs that is interposed amongst the plurality of registers to ensure a check edge message is provided from at least one register of the plurality of registers to the bit engine;

during check node processing, a second select signal is provided to the plurality of MUXs that is interposed amongst the plurality of registers to ensure a bit edge message is provided from at least one register of the plurality of registers to the check engine;

the plurality of registers is hard-wired to the bit engine and the check engine based on at least one non-null location within the parity check matrix of the LDPC code by which the LDPC coded signal is generated;

the parity check matrix of the LDPC code by which the LDPC coded signal is generated includes a plurality of square sub-matrices.

19. The decoder of claim 18, wherein:

the parity check matrix of the LDPC code by which the LDPC coded signal is generated includes a plurality of CSI (Cyclic Shifted Identity) sub-matrices.

20. The decoder of claim 18, wherein:

the decoder is implemented within a communication device that is operable to receive the LDPC coded signal from a communication channel; and the communication device is implemented within at least one of a satellite communication system, a wireless communication system, a wired communication system, and a fiber-optic communication system.

* * * * *